United States Patent
Lee et al.

(10) Patent No.: US 12,136,563 B2
(45) Date of Patent: Nov. 5, 2024

(54) SEMICONDUCTOR MANUFACTURING APPARATUS INCLUDING BONDING HEAD

(71) Applicant: Samsung Electronics Co., Ltd., Suwon-si (KR)

(72) Inventors: Mingu Lee, Cheonan-si (KR); Chulhyun Park, Anyang-si (KR); Kangsan Lee, Hwaseong-si (KR); Eunhaeng Lee, Suwon-si (KR); Euisun Choi, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 740 days.

(21) Appl. No.: 17/315,604

(22) Filed: May 10, 2021

(65) Prior Publication Data
US 2022/0102185 A1    Mar. 31, 2022

(30) Foreign Application Priority Data

Sep. 25, 2020 (KR) .......................... 10-2020-0125090

(51) Int. Cl.
*H01L 21/683* (2006.01)
*H01L 21/677* (2006.01)
*H01L 21/68* (2006.01)

(52) U.S. Cl.
CPC .... *H01L 21/6838* (2013.01); *H01L 21/67796* (2013.01); *H01L 21/681* (2013.01)

(58) Field of Classification Search
CPC .............. H01L 21/6838; H01L 21/681; H01L 21/67796; B25J 15/0633; B25J 15/0625

USPC .......................................... 294/186, 188, 189
See application file for complete search history.

(56) References Cited

U.S. PATENT DOCUMENTS

| 4,049,484 A | * | 9/1977 | Priest | B44C 1/16 |
| | | | | 294/188 |
| 5,171,398 A | * | 12/1992 | Miyamoto | H01L 21/67132 |
| | | | | 269/21 |
| 5,192,070 A | * | 3/1993 | Nagai | B25J 15/0616 |
| | | | | 294/188 |
| 5,636,887 A | * | 6/1997 | Petropoulos | B65G 47/91 |
| | | | | 294/64.2 |
| 5,961,169 A | * | 10/1999 | Kalenian | B24B 37/30 |
| | | | | 414/941 |
| 6,502,808 B1 | * | 1/2003 | Stone | B25B 11/005 |
| | | | | 269/21 |

(Continued)

FOREIGN PATENT DOCUMENTS

| JP | 2005-150311 A | 6/2005 |
| JP | 5347235 B2 | 11/2013 |
| KR | 10-2018-0053473 A | 5/2018 |

*Primary Examiner* — Paul T Chin
(74) *Attorney, Agent, or Firm* — Muir Patent Law, PLLC

(57) ABSTRACT

A semiconductor manufacturing apparatus configured to bond a substrate to a semiconductor chip includes a support configured to mount a substrate on a main surface of the support; and a bonding head configured to transfer the semiconductor chip to stack the semiconductor chip on the substrate and including an attachment pad configured to attach the semiconductor chip, wherein the attachment pad includes a bottom surface configured to attach the semiconductor chip; a vacuum channel extending from the bottom surface; and a cavity, and wherein the bonding head is configured to adjust a shape of the bottom surface of the attachment pad by adjusting a pressure of air in the cavity.

20 Claims, 30 Drawing Sheets

(56) References Cited

U.S. PATENT DOCUMENTS

| | | |
|---|---|---|
| 7,416,011 B2 | 8/2008 | Mandel et al. |
| 7,650,688 B2 | 1/2010 | Lee et al. |
| 8,016,010 B2 * | 9/2011 | Ng .......................... H01L 24/75 |
| | | 29/740 |
| 8,307,543 B2 | 11/2012 | Lee |
| 9,842,823 B2 | 12/2017 | Yu et al. |
| 10,580,752 B2 | 3/2020 | Yamauchi |
| 10,836,048 B2 * | 11/2020 | Nakayama ............. B65G 47/91 |
| 11,241,802 B2 * | 2/2022 | Douglas ............... B25J 15/0691 |
| 2003/0115747 A1 | 6/2003 | Schnetzler et al. |

\* cited by examiner

FIG. 13
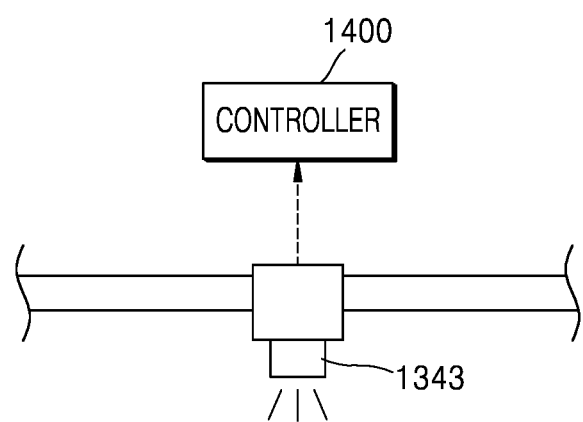
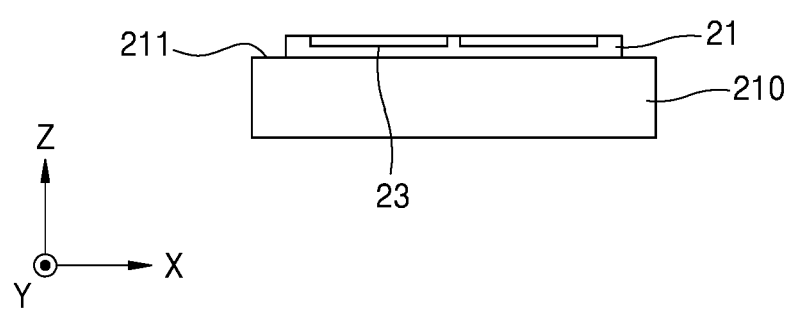

SEMICONDUCTOR MANUFACTURING APPARATUS INCLUDING BONDING HEAD

CROSS-REFERENCE TO RELATED APPLICATION

This application is based on and claims priority under 35 U.S.C. § 119 to Korean Patent Application No. 10-2020-0125090, filed on Sep. 25, 2020, in the Korean Intellectual Property Office, the disclosure of which is incorporated by reference herein in its entirety.

BACKGROUND

The inventive concept relates to a semiconductor manufacturing device, and more particularly, to a semiconductor manufacturing device including a bonding head for a chip bonding process.

A semiconductor device having a structure in which semiconductor chips are stacked may be advantageous in improving a mounting density of the semiconductor chips, shortening a length of an electrical connection path between the semiconductor chips, and processing a high-speed signal. To manufacture a semiconductor device having a structure in which semiconductor chips are stacked, a method of stacking semiconductor chips by disposing a film including an adhesive component between the semiconductor chips has been used in the related art, but a direct bonding method of directly bonding semiconductor chips without using an adhesive medium is recently being used.

SUMMARY

The inventive concept provides a bonding head for a chip bonding process and a semiconductor manufacturing apparatus including the same.

According to an aspect of the inventive concept, there is provided a semiconductor manufacturing apparatus configured to bond a substrate to a semiconductor chip, the semiconductor manufacturing apparatus including a support configured to mount the substrate on a main surface of the support; and a bonding head configured to transfer a semiconductor chip to stack the semiconductor chip on the substrate and including an attachment pad configured to attach the semiconductor chip, wherein the attachment pad includes a bottom surface configured to attach the semiconductor chip; a vacuum channel extending from the bottom surface; and a cavity, and wherein the bonding head is configured to adjust a shape of the bottom surface of the attachment pad by adjusting a pressure of air in the cavity.

According to another aspect of the inventive concept, there is provided a semiconductor manufacturing apparatus configured to bond a substrate to a semiconductor chip, the semiconductor manufacturing apparatus including a support configured to mount the substrate on a main surface of the support; and a bonding head configured to transfer a semiconductor chip to stack the semiconductor chip on the substrate, wherein the bonding head includes an attachment pad configured to attach the semiconductor chip; and a tilting movement actuator configured to tilt the attachment pad around a tilting axis extending in a direction parallel to the main surface of the support and including an actuator.

According to another aspect of the inventive concept, there is provided a semiconductor manufacturing apparatus including a loading stage configured to load a ring frame on which a semiconductor chip is mounted; a loading/unloading stage for loading and unloading a substrate; a chip separation stage configured to reduce adhesion of an adhesive film of the ring frame supporting the semiconductor chip; a bonding stage configured to perform a bonding process between the substrate and the semiconductor chip, the bonding stage including a support having a main surface configured to receive the substrate; and a bonding head configured to stack the semiconductor chips on the substrate mounted on the support; and a chip transfer module configured to transfer the semiconductor chip from the chip separation stage toward the bonding head, wherein the bonding head includes an attachment pad including a bottom surface configured to attach to the semiconductor chip and a cavity provided in the attachment pad, and an air pressure adjuster configured to inject or exhaust air into or from the cavity of the attachment pad, such that the pressure of air in the cavity of the attachment pad is adjusted.

BRIEF DESCRIPTION OF THE DRAWINGS

Embodiments of the inventive concept will be more clearly understood from the following detailed description taken in conjunction with the accompanying drawings in which:

FIG. 13 is a conceptual diagram showing a process of detecting a position of a substrate by using a second image capturing device according to example embodiments.

DETAILED DESCRIPTION OF THE EMBODIMENTS

Figure 1:
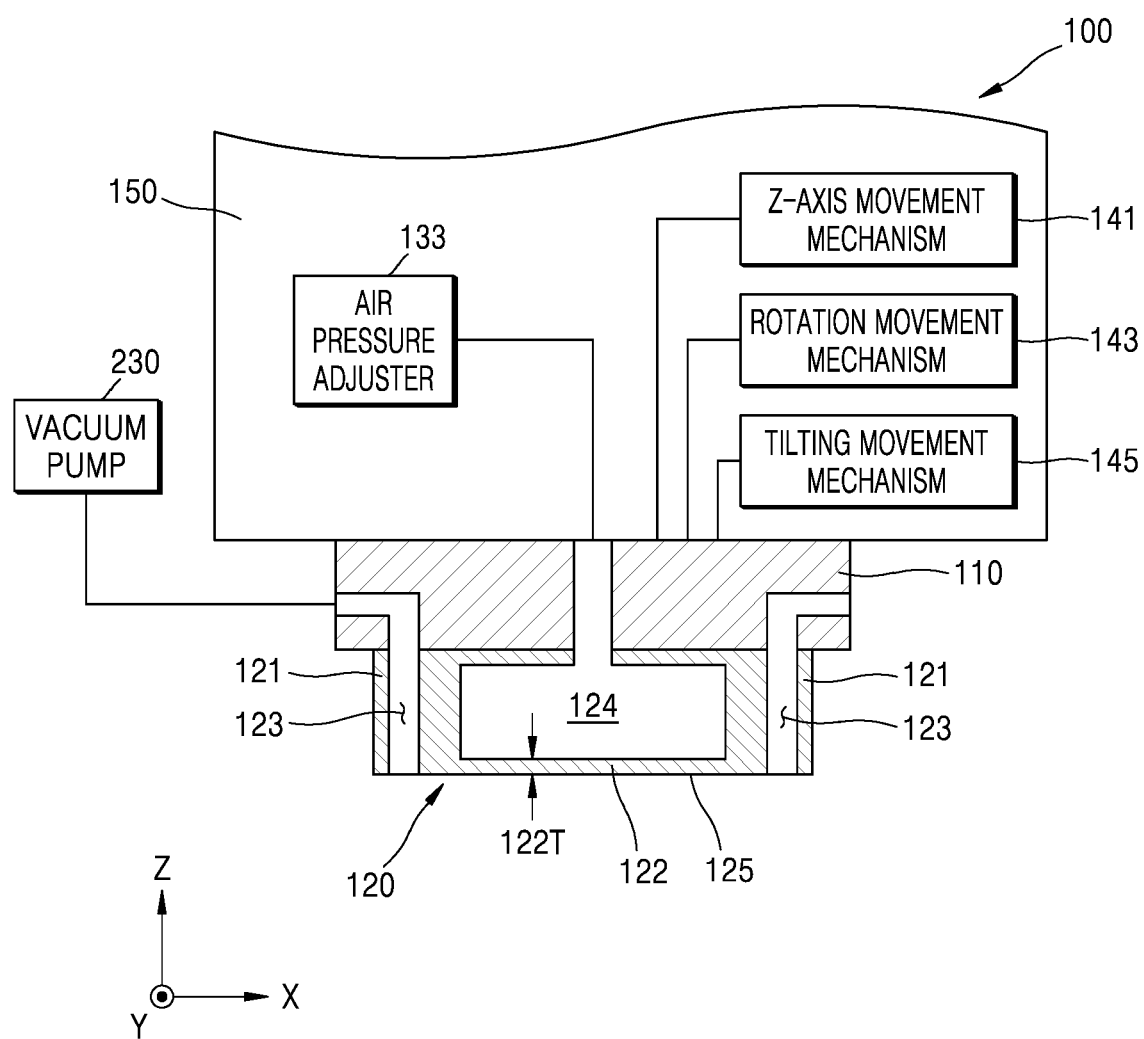
FIG. 1 is a cross-sectional view of a bonding head according to example embodiments.

FIG. 1 is a cross-sectional view of a bonding head 100 according to example embodiments.

The bonding head 100 according to example embodiments may be included in a bonding module for performing a bonding process between a semiconductor chip and a substrate. The bonding head 100 may transfer a semiconductor chip, such that the semiconductor chip is stacked on a substrate. The bonding head 100 may be provided in a bonding module configured to perform a die-to-wafer bonding process for bonding a semiconductor chip and a substrate without a separate adhesion medium. However, an application example of the bonding head 100 is not limited thereto. For example, the bonding head 100 may be provided in a bonding module configured to perform a wafer-to-wafer bonding process for bonding two wafers, a chip-to-chip bonding process for bonding two chips, etc.

The bonding head 100 may include a base 110 and an attachment pad 120 coupled to the base 110. The attachment pad 120 may have a pillar-like shape and/or a hexahedral shape. The attachment pad 120 may include a bottom surface 125 to which a semiconductor chip 11 (refer to FIG. 4A) to be bonded is attached.

In example embodiments, the bonding head 100 may be configured to vacuum-adsorb the semiconductor chip 11. For example, the bonding head 100 may include a vacuum channel 123 connected to a vacuum pump 230. The vacuum channel 123 may be exposed through the bottom surface 125 of the attachment pad 120. The vacuum channel 123 may be provided inside sidewalls 121 of the attachment pad 120 forming the outer portion of the attachment pad 120, and an end portion of the vacuum channel 123 may be at an outer region of the bottom surface 125 of the attachment pad 120. For example, the vacuum channel 123 may vertically pass through the attachment pad 120, e.g., from the bottom surface 125 to an upper surface of the attachment pad 120.

Spatially relative terms, such as "beneath," "below," "lower," "above," "upper," "vertical," "horizontal" and the like, may be used herein for ease of description to describe positional relationships. It will be understood that the spatially relative terms encompass different orientations of the device in addition to the orientation depicted in the figures.

When the attachment pad 120 is located in contact with or adjacent to one surface of the semiconductor chip 11, the vacuum pump 230 may apply a vacuum pressure to the vacuum channel 123, thereby allowing the semiconductor chip 11 to be vacuum-adsorbed to the attachment pad 120. For example, when the vacuum pump 230 applies a vacuum pressure to the vacuum channel 123, a pressure lower than an ambient pressure of the semiconductor chip 11 may be formed on the surface of the semiconductor chip 11, and thus, the semiconductor chip 11 may be vacuum-adsorbed to the attachment pad 120. Also, the vacuum pump 230 may release or terminate the vacuum pressure with respect to the vacuum channel 123 to allow the semiconductor chip 11 to separate from the attachment pad 120.

In other example embodiments, the bonding head 100 may be configured to support the semiconductor chip 11 using an electrostatic force or to support the semiconductor chip 11 in a mechanical manner.

The attachment pad 120 may be configured to be deformed by air pressure. For example, the attachment pad 120 includes a cavity 124 formed therein, and the shape of the attachment pad 120 may be changed as the pressure of air in the cavity 124 is adjusted (e.g., changes). The cavity 124 may be a space defined by the sidewalls 121 of the attachment pad 120 in which the vacuum channel 123 is formed and a bottom portion 122 of the attachment pad 120 including the bottom surface 125.

The bonding head 100 may include an air pressure adjuster 133 configured to adjust the internal pressure of the cavity 124. The air pressure adjuster 133 may regulate the internal pressure of the cavity 124 by injecting the air into the cavity 124 or exhausting the air from the cavity 124. For example, the air pressure adjuster 133 may include an air injection pump configured to inject the air into the cavity 124, an exhaust pump for exhausting the air in the cavity 124, and a flux control valve like a solenoid valve.

The air pressure adjuster 133 may adjust the internal pressure of the cavity 124, thereby changing the shape of the bottom surface 125 of the attachment pad 120. In an initial state of the attachment pad 120, the bottom surface 125 of the attachment pad 120 may have a flat shape. When the air pressure adjuster 133 injects the air into the cavity 124 such that the pressure in the cavity 124 of the attachment pad 120 becomes higher than a reference pressure (e.g., a pressure equivalent to the atmospheric pressure), the volume of the cavity 124 may be increased and the bottom surface 125 of the attachment pad 120 may be deformed convexly downward. Also, when the bottom surface 125 of the attachment pad 120 is deformed to be convex downward and the air pressure adjuster 133 lowers the pressure of air in the cavity 124 to the reference pressure, the shape of the attachment pad 120 may be elastically restored to the initial state, and the bottom surface 125 of the attachment pad 120 may be restored to the flat shape.

In example embodiments, a thickness 122T of the bottom portion 122 of the attachment pad 120 may be from about 0.5 mm to about 20 mm. When the thickness 122T of the bottom portion 122 of the attachment pad 120 is less than 0.5 mm, it may be difficult to apply an external force for deformation of the semiconductor chip 11 to the semiconductor chip 11. When the thickness 122T of the bottom portion 122 of the attachment pad 120 is greater than 20 mm, the range in which the curvature of the bottom surface 125 is changed may become too narrow.

In example embodiments, a horizontal width of the attachment pad 120 in the horizontal direction (e.g., an X direction or a Y direction) may be between 50% and 150% of a horizontal width of the semiconductor chip 11 attached to the attachment pad 120 (e.g., a width in the X direction or the Y direction). For example, when the horizontal width of the semiconductor chip 11 is about 10 mm, the horizontal width of the attachment pad 120 may be from about 5 mm to about 15 mm.

Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

In some example embodiments, the horizontal width of the attachment pad 120 may be less than the horizontal width of the semiconductor chip 11. In this case, the bonding head 100 may be positioned to align the center of the semiconductor chip 11 with the center of the bottom surface 125 of the attachment pad 120 and vacuum-adsorb the semiconductor chip 11, such that the semiconductor chip 11 is stably supported by the attachment pad 120.

The attachment pad 120 may include or be formed of a material that may be deformed by an external force. For example, the attachment pad 120 may include or be formed of silicon, rubber, ceramic, metal, or a combination thereof. In example embodiments, the attachment pad 120 may include or be formed of silicon rubber.

In exemplary embodiments, the bonding head 100 may further include a Z-axis movement mechanism 141 for moving the attachment pad 120 up and down. The Z-axis movement mechanism 141 may move the attachment pad 120 up and down in the Z direction, thereby adjusting a position of the attachment pad 120 along the Z-axis. Here, the Z direction may be defined as a direction perpendicular to a main surface (211 of FIG. 4B) of a support (210 of FIG. 4B) on which a substrate (21 of FIG. 4B) is mounted. The Z-axis movement mechanism 141 may move the attachment pad 120 to which the semiconductor chip 11 is attached up and down, such that a pick-and-place operation may be performed. Also, the Z-axis movement mechanism 141 may be configured to apply an appropriate pressure to the semiconductor chip 11 when the semiconductor chip 11 is bonded to the substrate 21. The Z-axis movement mechanism 141 may be implemented by an actuator like a motor, a hydraulic cylinder, a pneumatic cylinder, etc.

A bonding process using the bonding head 100 may be controlled by a controller provided in a bonding module. The controller may be implemented by hardware, firmware, software, or any combination thereof. For example, the controller may be a computing device like a workstation computer, a desktop computer, a laptop computer, or a tablet computer. For example, the controller may include a memory device like read only memory (ROM) and/or random access memory (RAM) and a processor configured to perform predetermined operations and algorithms, e.g., a microprocessor, a central processing unit (CPU), a graphics processing unit (GPU), etc. Also, the controller may include a receiver and a transmitter for receiving and transmitting electrical signals.

Figure 2:
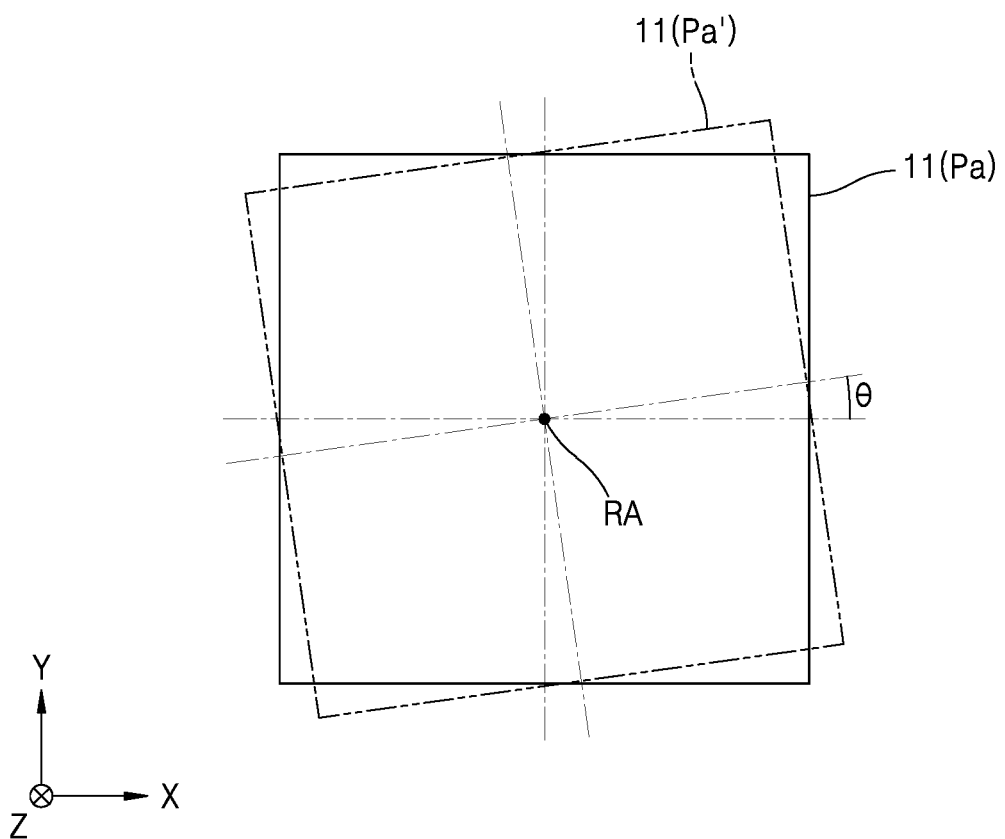
FIG. 2 is a conceptual view of a process of rotating a semiconductor chip using the bonding head of FIG. 1.

FIG. 2 is a conceptual view of a process of rotating the semiconductor chip 11 using the bonding head 100 of FIG. 1.

In FIG. 2, the reference numeral "11(Pa)" denotes the semiconductor chip 11 positioned at a first position (or a reference position) in a rotational direction, and the reference numeral "11(Pa')" denotes the semiconductor chip 11 positioned at a second position in the rotational direction.

Referring to FIGS. 1 and 2, the bonding head 100 may include a rotation movement mechanism 143 for a rotation movement of the attachment pad 120. The rotation movement mechanism 143 may rotate the semiconductor chip 11 attached to the attachment pad 120 around a rotation axis RA in the Z-direction, thereby adjusting a position of the semiconductor chip 11 in the rotational direction. The position of the semiconductor chip 11 in the rotational direction may refer to a rotation angle θ to which the semiconductor chip 11 is rotated around the rotation axis RA in the Z-direction from a reference position on an XY plane parallel to the main surface 211 (refer to FIG. 4B) of the support 210 (refer to FIG. 4B) on which the substrate 21 (refer to FIG. 4B) is mounted.

The rotation movement mechanism 143 may rotate the attachment pad 120 or a structure (e.g., the base 110) to which the attachment pad 120 is coupled, around the rotation axis RA in the Z direction. For example, the rotation movement mechanism 143 may be configured to rotate the attachment pad 120 to which the semiconductor chip 11 is attached or a structure (e.g., the base 110) to which the attachment pad 120 is coupled, on the XY plane parallel to the main surface 211 of the support 210 on which the substrate 21 is mounted. The rotation movement mechanism 143 may rotate the attachment pad 120 such that the semiconductor chip 11 is aligned with respect to the chip of the substrate 21 in the rotational direction before the bonding between the semiconductor chip 11 and the substrate 21 is started. The rotation movement mechanism 143 may be implemented by an actuator like a rotation motor.

Figure 3:
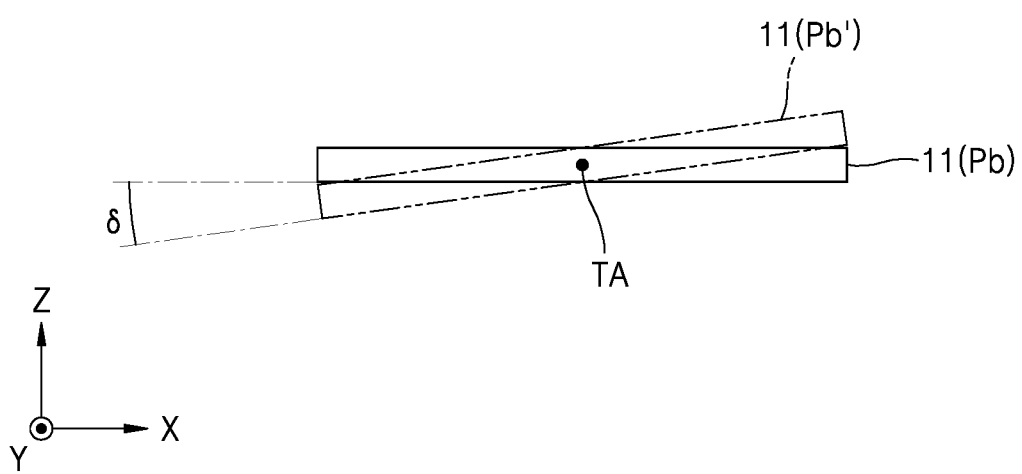
FIG. 3 is a conceptual diagram showing a tilting movement process of a semiconductor chip using the bonding head of FIG. 1.

FIG. 3 is a conceptual diagram showing a tilting movement process of the semiconductor chip 11 using the bonding head 100 of FIG. 1.

In FIG. 3, the reference numeral "11(Pb)" denotes the semiconductor chip 11 positioned at a first position (or a reference position) in the tilting direction, and the reference numeral "11(Pb')" denotes the semiconductor chip 11 positioned at a second position in the tilting direction.

Referring to FIGS. 1 and 3, the bonding head 100 may include a tilting movement mechanism 145 for tilting movement of the attachment pad 120. The tilting movement mechanism 145 may tilt the semiconductor chip 11 attached to the attachment pad 120 around a tilting axis TA extending in a direction (e.g., the X direction or the Y direction) parallel to a main surface (e.g., 211 in FIG. 4B) of a support (e.g., 210 in FIG. 4B) on which the substrate (e.g., 21 in FIG. 4B) is mounted, thereby adjusting a position of the semiconductor chip 11 in the tilting direction. For example, the position of the semiconductor chip 11 in the tilting direction may refer to a tilting angle δ at which the bonding surface (12 of FIG. 4B) of the semiconductor chip 11 is tilted from the reference position around the tilting axis TA extending in a direction (e.g., the X direction or the Y direction) parallel to the main surface 211 of the support 210.

The tilting movement mechanism 145 may tilt the attachment pad 120 or a structure (e.g., the base 110) to which the attachment pad 120 is coupled, around the tilting axis TA extending in the direction parallel to the main surface 211 of the support 210. For example, the base 110 may be tiltably mounted on a frame 150 of the bonding head 100, and the tilting movement mechanism 145 may tilt the base 110, thereby tilting the attachment pad 120 coupled to the base 110. The tilting movement mechanism 145 may tilt the attachment pad 120, such that the bonding surface 12 of the semiconductor chip 11 and the bonding surface 22 (refer to FIG. 4B) of the substrate 21 are positioned in parallel with each other before the bonding between the semiconductor chip 11 and the substrate 21 is started. Alternatively, the tilting movement mechanism 145 may tilt the attachment pad 120, such that an angle between the bonding surface 12 of the semiconductor chip 11 and the bonding surface 22 of the substrate 21 is at a predetermined angle (e.g., an angle between 0.5 degrees and 15 degrees) before the bonding between the semiconductor chip 11 and the substrate 21 is started. The tilting movement mechanism 145 may be implemented by an actuator like a motor, a hydraulic cylinder, a pneumatic cylinder, etc.

FIGS. 4A through 4E are cross-sectional diagrams showing an example method of a chip-substrate bonding using the bonding head 100 of FIG. 1.

Figure 4A:
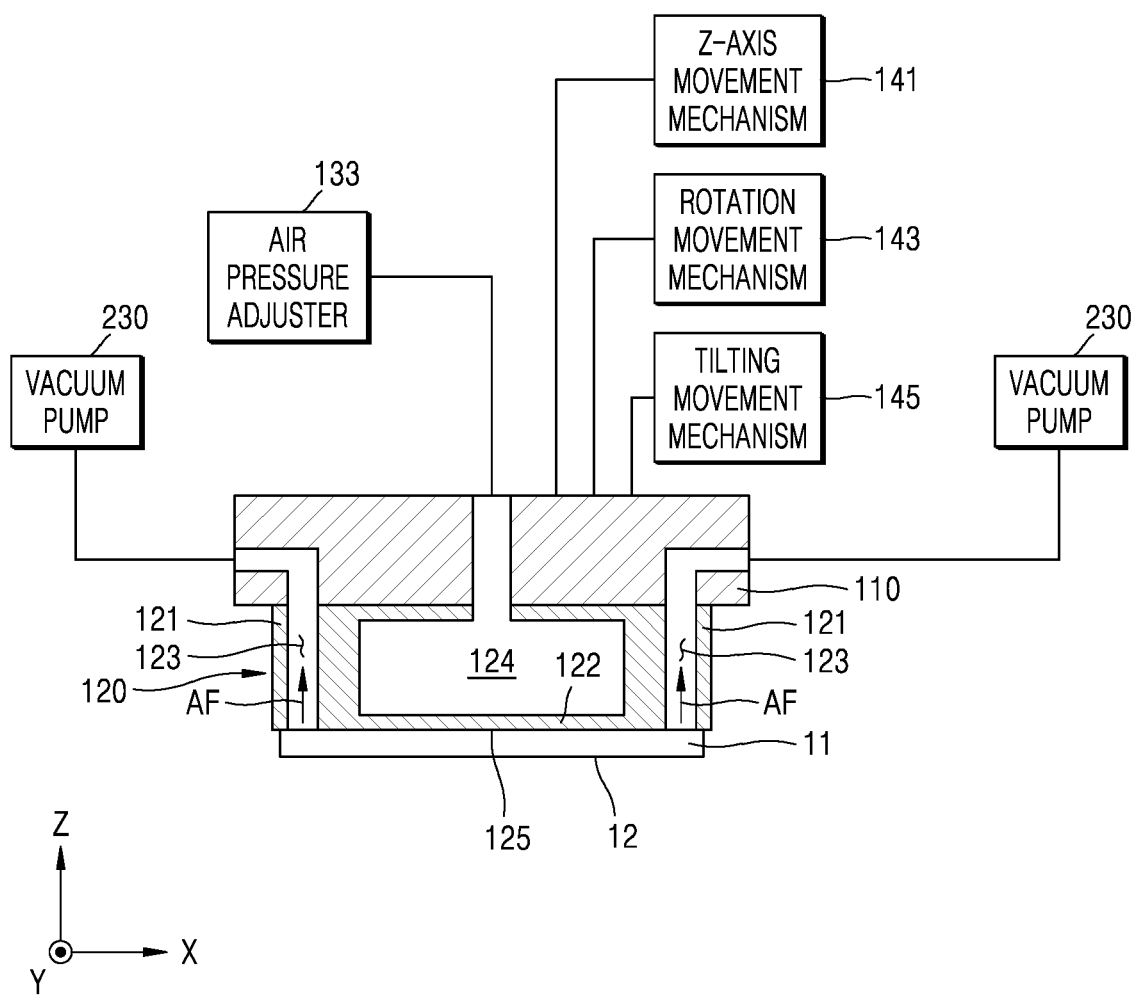
FIGS. 4A through 4E are cross-sectional diagrams showing an example method of a chip-substrate bonding using the bonding head of FIG. 1.

Referring to FIG. 4A, the bonding head 100 may fix the semiconductor chip 11 to the bottom surface 125 of the attachment pad 120. The bonding head 100 may adjust a position of the attachment pad 120 in the Z direction such that the bottom surface 125 of the attachment pad 120 is in contact with or adjacent to one surface of the semiconductor chip 11, and then vacuum-adsorb the semiconductor chip 11 by using the vacuum pump 230. When the vacuum pump 230 applies a vacuum pressure to vacuum channels 123, an adsorption force AF for vacuum-adsorbing of the semiconductor chip 11 may be applied to the semiconductor chip 11 through the vacuum channels 123.

The attachment pad 120 supports the semiconductor chip 11, such that the bonding surface 12 of the semiconductor chip 11 faces downward, and a surface of the semiconductor chip 11 opposite to the bonding surface 12 of the semiconductor chip 11 may contact the bottom surface 125 of the attachment pad 120.

Figure 4B:
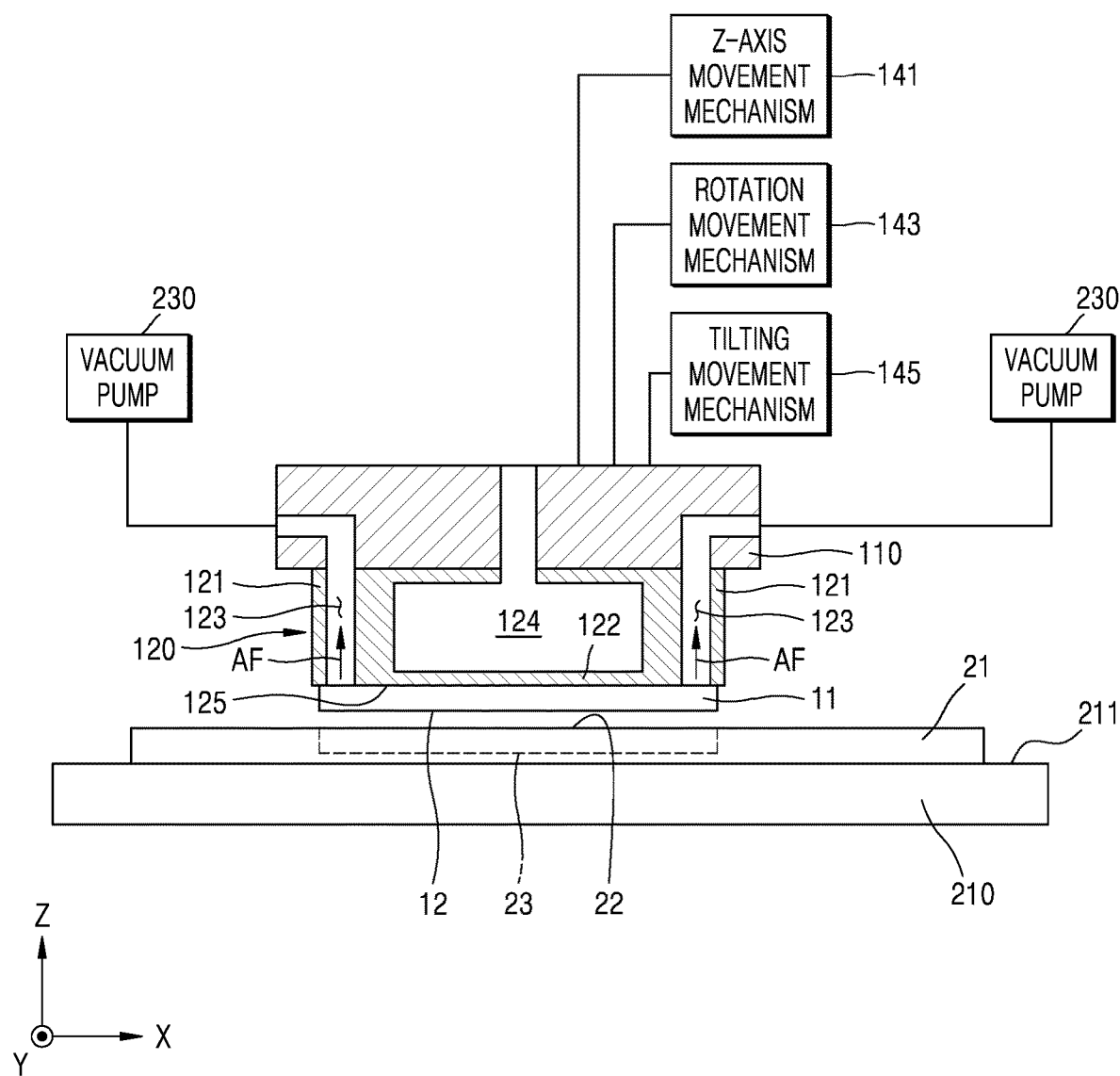

Referring to FIG. 4B, the bonding head 100 may move above the support 210 on which the substrate 21 is mounted. The bonding head 100 may move to a position where the semiconductor chip 11 and a chip 23 of the substrate 21 are aligned with each other. Also, the bonding head 100 may move the attachment pad 120 such that the bonding surface 12 of the semiconductor chip 11 is spaced apart from the bonding surface 22 of the substrate 21 by a predetermined distance. For example, a distance between the bonding surface 12 of the semiconductor chip 11 and the bonding surface 22 of the substrate 21 may be from about 20 μm to about 200 μm. In example embodiments, the distance between the bonding surface 12 of the semiconductor chip 11 and the bonding surface 22 of the substrate 21 may be about 100 μm. When the distance between the bonding surface 12 of the semiconductor chip 11 and the bonding surface 22 of the substrate 21 is too large, bonding between the semiconductor chip 11 and the substrate 21 may be poorly propagated, e.g., may not be properly bonded. When the distance between the bonding surface 12 of the semiconductor chip 11 and the bonding surface 22 of the substrate 21 is too small, the bonding between the semiconductor chip 11 and the substrate 21 may propagate too quickly, e.g., from a first contact point to the last contact point between the bonding surface 12 of the semiconductor chip 11 and the bonding surface 22 of the substrate 21, and thus, a void may remain between the semiconductor chip 11 and the substrate 21.

Figure 4C:
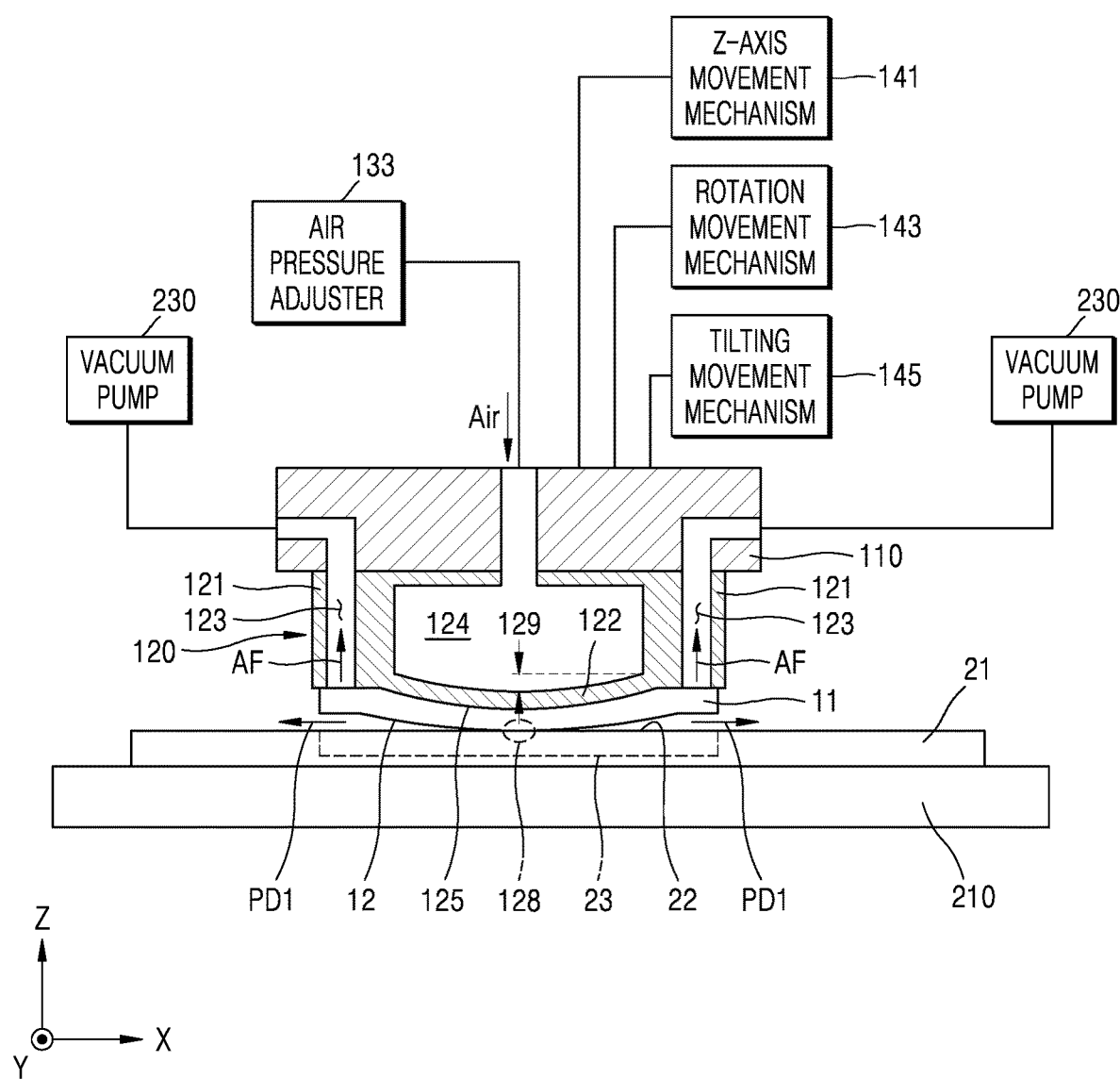

Referring to FIG. 4C, when the semiconductor chip 11 is attached to the attachment pad 120, the bonding head 100 may deform the attachment pad 120, thereby forcibly changing the shape of the semiconductor chip 11 attached to the attachment pad 120.

For example, as shown in FIG. 4B, a state in which the center region and the edge region of the bottom surface 125 of the attachment pad 120 are at the same level, e.g., in a vertical direction, such that the bottom surface 125 of the attachment pad 120 is flat, may be defined as an initial state of the attachment pad 120. As shown in FIG. 4C, as the air is injected into the cavity 124 of the attachment pad 120 and the pressure of air in the cavity 124 is increased, a state in which at least a portion of the bottom surface 125 of the attachment pad 120 is convex as a center region of the bottom surface 125 of the attachment pad 120 protrudes downward with respect to the edge region may be defined as a deformed state of the attachment pad 120. The bonding head 100 may be configured to adjust the pressure of air in the cavity 124, thereby adjusting the shape of the attachment pad 120 between the initial state and the deformed state of the attachment pad 120.

When a displacement of the bottom portion 122 of the attachment pad 120 between the initial state and the deformed state of the attachment pad 120 is referred to as a deformed height 129 of the attachment pad 120, the deformed height 129 of the attachment pad 120 may be from about 20 μm to about 200 μm. The deformed height 129 of the attachment pad 120 may be the same as a height difference between the center region and the edge region of the bottom surface 125 of the attachment pad 120 in the deformed state of the attachment pad 120.

When the attachment pad 120 is deformed from the initial state to the deformed state while the semiconductor chip 11 is being vacuum-adsorbed on the attachment pad 120, the semiconductor chip 11 attached to the attachment pad 120 may be forcibly deformed to a shape corresponding to the bottom surface 125 of the attachment pad 120. For example, the semiconductor chip 11 may be deformed, such that a center portion thereof protrudes downward with respect to the outer portion thereof. Here, the curvature of the semiconductor chip 11 that is forcibly deformed may be adjusted by the curvature of the bottom surface 125 of the attachment pad 120.

The center portion of the semiconductor chip 11 that is forcibly deformed may contact the substrate 21. The center portion of the semiconductor chip 11 may be pressed by the attachment pad 120, which is expanded, and thus a contact point may be formed between the center portion of the semiconductor chip 11 and the substrate 21. The contact point between the semiconductor chip 11 and the substrate 21 may be defined as a bonding initiation point 128 at which bonding between the semiconductor chip 11 and the substrate 21 starts. The bonding head 100 may adjust the pressure of air in the cavity 124, such that the semiconductor chip 11 and the substrate 21 contact each other at the bonding initiation point 128 at an appropriate pressure.

When the bonding initiation point 128 between the semiconductor chip 11 and the substrate 21 is formed, a bonding region between the semiconductor chip 11 and the substrate 21 may gradually propagate/expand in a propagation direction PD1 that is radially away from the bonding initiation point 128. While the bonding region between the semiconductor chip 11 and the substrate 21 is being propagated, the outer portion of the semiconductor chip 11 is vacuum-adsorbed by the attachment pad 120, and thus, the bonding region between the semiconductor chip 11 and the substrate 21 does not propagate to the outer region of the bonding surface 12 of the semiconductor chip 11.

When the semiconductor chip 11 is bonded to the substrate 21, the bonding region may be spontaneously propagated without application of other external force. For example, each of the bonding surface 12 of the semiconductor chip 11 and the bonding surface 22 of the substrate 21 may include a plasma-processed or wet-processed surface. For example, each of the bonding surface 12 of the semiconductor chip 11 and the bonding surface 22 of the substrate 21 may have an —OH functional group, and thus, the bonding between the semiconductor chip 11 and the substrate 21 may be spontaneously performed through a hydrogen bond between the —OH functional group of the bonding surface 12 of the semiconductor chip 11 and the —OH functional group of the bonding surface 22 of the substrate 21.

In example embodiments, while bonding between the semiconductor chip 11 and the substrate 21 is being propagated, the bonding head 100 may lower the pressure of air in the cavity 124 to help restoration of the bonding surface 12 of the semiconductor chip 11 to a flat state. When the pressure of air in the cavity 124 is lowered, the bonding surface 12 of the semiconductor chip 11 is bonded to the bonding surface 22 of the substrate 21 in a substantially flat state, and thus, the bonding between the semiconductor chip 11 and the substrate 21 may be more easily propagated.

It will be appreciated that "planarization," "co-planar," "planar," "flat," etc., as used herein refer to structures (e.g., surfaces) that need not be perfectly geometrically planar, but may include acceptable variances that may result from standard manufacturing processes. The term "substantially" may be used herein to emphasize this meaning, unless the context or other statements indicate otherwise.

Figure 4D:
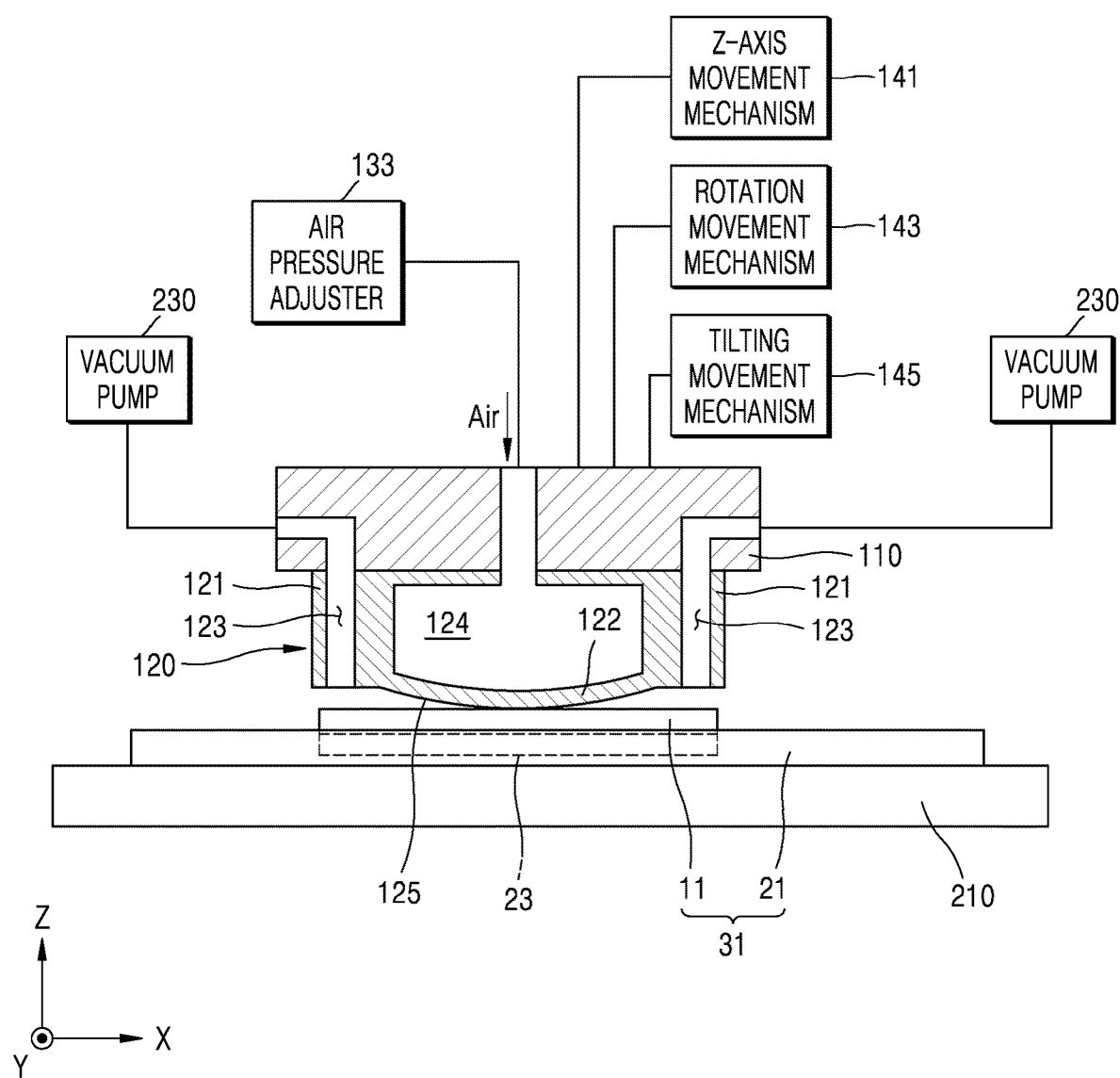

Referring to FIG. 4D, the bonding head 100 releases the vacuum adsorption on the semiconductor chip 11, such that the semiconductor chip 11 may be separated from the attachment pad 120. When the vacuum adsorption on the outer portion of the semiconductor chip 11 is released, the semiconductor chip 11 that is forcibly deformed is restored to a flat state, and the outer region of the bonding surface 12 of the semiconductor chip 11 may be bonded to the bonding surface 22 of the substrate 21. When the outer region of the bonding surface 12 of the semiconductor chip 11 is bonded to the bonding surface 22 of the substrate 21, the bonding between the semiconductor chip 11 and the substrate 21 is completed, and thus, a bonding structure 31 having a structure in which the semiconductor chip 11 is stacked on the chip 23 included in the substrate 21 may be formed. For example, the chip 23 may be a chip structure and/or a circuit structure formed in the substrate 21.

Figure 4E:
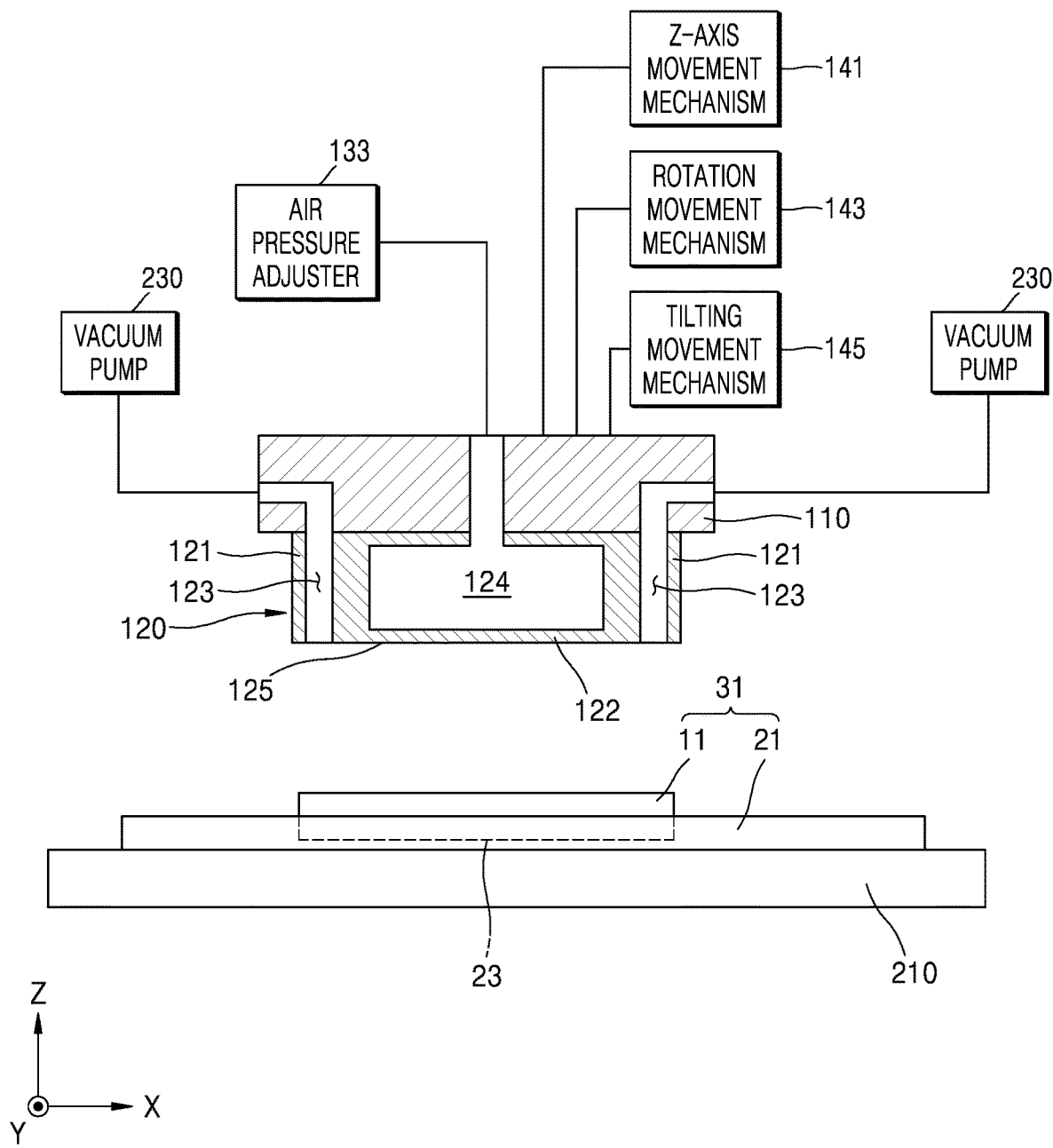

Referring to FIG. 4E, when the bonding between the semiconductor chip 11 and the substrate 21 is completed, the bonding head 100 moves upward away from the support 210. Thereafter, the bonding structure 31 is unloaded from the support 210.

According to example embodiments, when the semiconductor chip 11 and the substrate 21 are bonded to each other, the bonding region between the semiconductor chip 11 and the substrate 21 is gradually propagated from the center region of the semiconductor chip 11 toward the outer region of the semiconductor chip 11, and thus, a void may be discharged to the outside of the semiconductor chip 11 in the propagation direction PD1 (refer to FIG. 4C). Accordingly, in the bonding structure 31, a void does not remain at the interface between the semiconductor chip 11 and the substrate 21, and thus, the bonding reliability between the semiconductor chip 11 and the substrate 21 may be improved.

FIGS. 5A through 5D are cross-sectional diagrams showing an example method of a chip-substrate bonding using the bonding head 100 of FIG. 1.

Hereinafter, a chip-substrate bonding method according to example embodiments will be described by focusing on differences from the chip-substrate bonding method described with reference to FIGS. 4A to 4E.

Figure 5A:
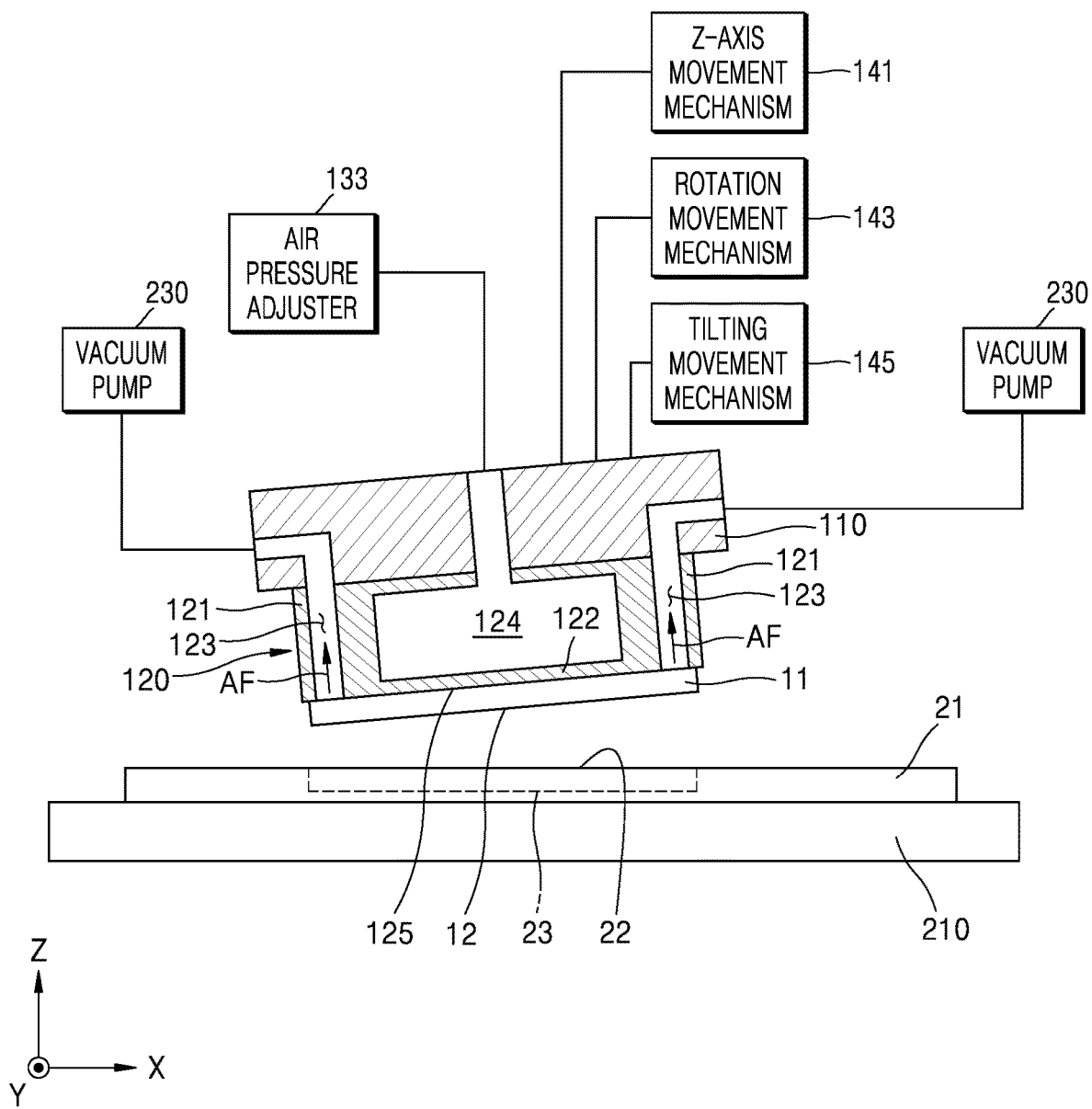
FIGS. 5A through 5D are cross-sectional diagrams showing an example method of a chip-substrate bonding using the bonding head of FIG. 1.

Referring to FIG. 5A, the bonding head 100 positions the attachment pad 120 to align the semiconductor chip 11 in the Z direction with respect to the chip 23 of the substrate 21, and then the bonding head 100 tilts the attachment pad 120 by using the tilting movement mechanism 145. The tilting movement mechanism 145 may tilt the attachment pad 120 around a tilting axis extending in a direction (e.g., the Y direction) parallel to the main surface 211 of the support 210 on which the substrate 21 is mounted. The tilting movement mechanism 145 may tilt the attachment pad 120 to be inclined with respect to the bonding surface 12 of the semiconductor chip 11 attached to the attachment pad 120 and the bonding surface 22 of the substrate 21. For example, the attachment pad 120 may be tilted, such that an angle between the bonding surface 12 of the semiconductor chip 11 and the bonding surface 22 of the substrate 21 is within a range from about 0.5 degrees to about 15 degrees.

Figure 5B:
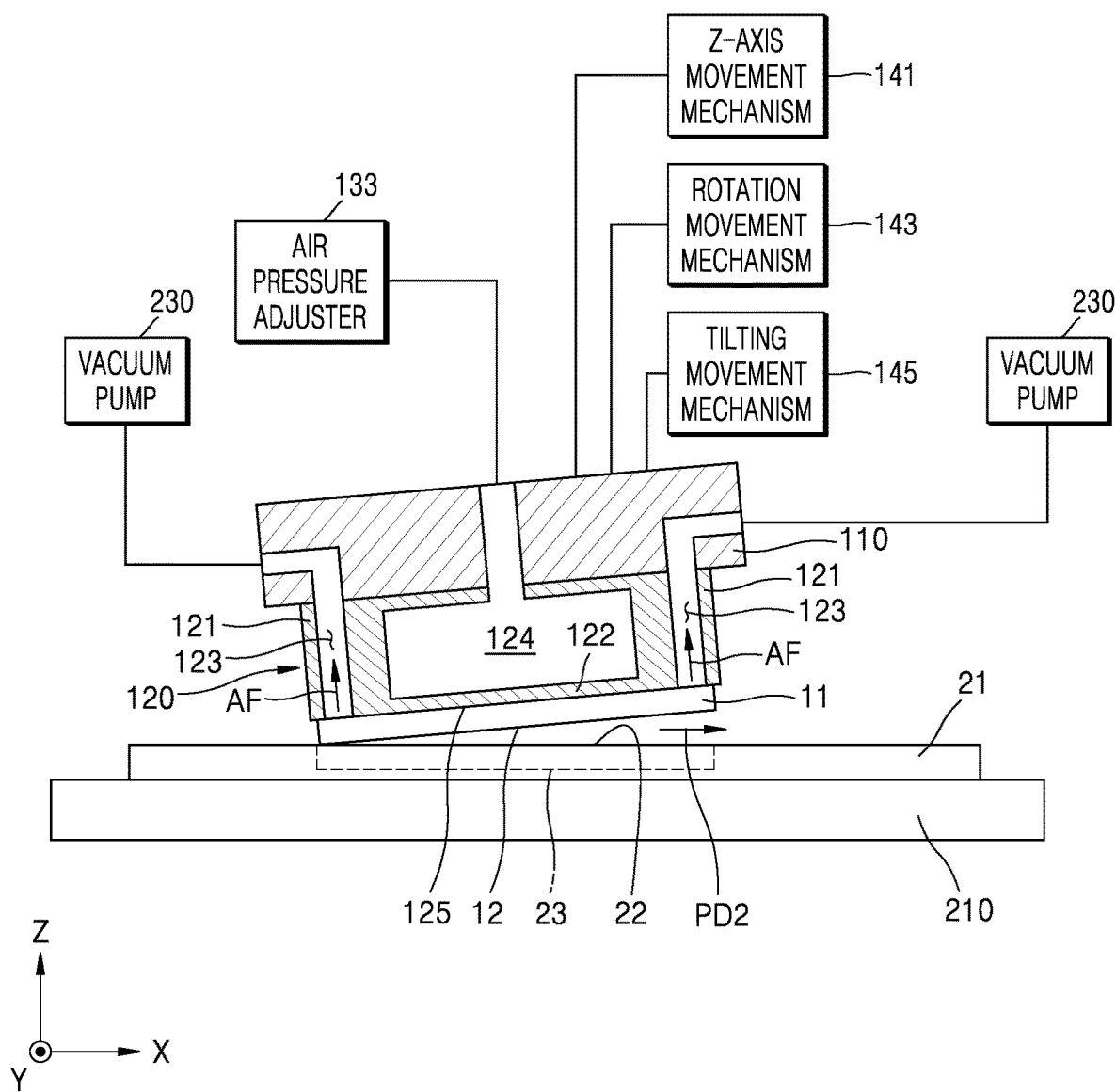

Referring to FIG. 5B, when the semiconductor chip 11 is tilted and an edge closest to the bonding surface 22 of the substrate 21 is referred to as a first edge of the bonding surface 12 of the semiconductor chip 11, the bonding head 100 may move the semiconductor chip 11 so that the first edge of the bonding surface 12 of the semiconductor chip 11 contacts the bonding surface 22 of the substrate 21. For example, the bonding head 100 may adjust a Z-axis position of the attachment pad 120, such that the first edge of the bonding surface 12 of the semiconductor chip 11 may contact the bonding surface 22 of the substrate 21. When the first edge of the bonding surface 12 of the semiconductor chip 11 contacts the bonding surface 22 of the substrate 21, bonding may be initiated from a portion where the first edge of the bonding surface 12 of the semiconductor chip 11 contacts the bonding surface 22 of the substrate 21. The bonding between the semiconductor chip 11 and the substrate 21 may be propagated in a propagation direction PD2 from the first edge of the bonding surface 12 of the semiconductor chip 11 toward a second edge of the bonding surface 12 of the semiconductor chip 11 opposite to the first edge.

Figure 5C:
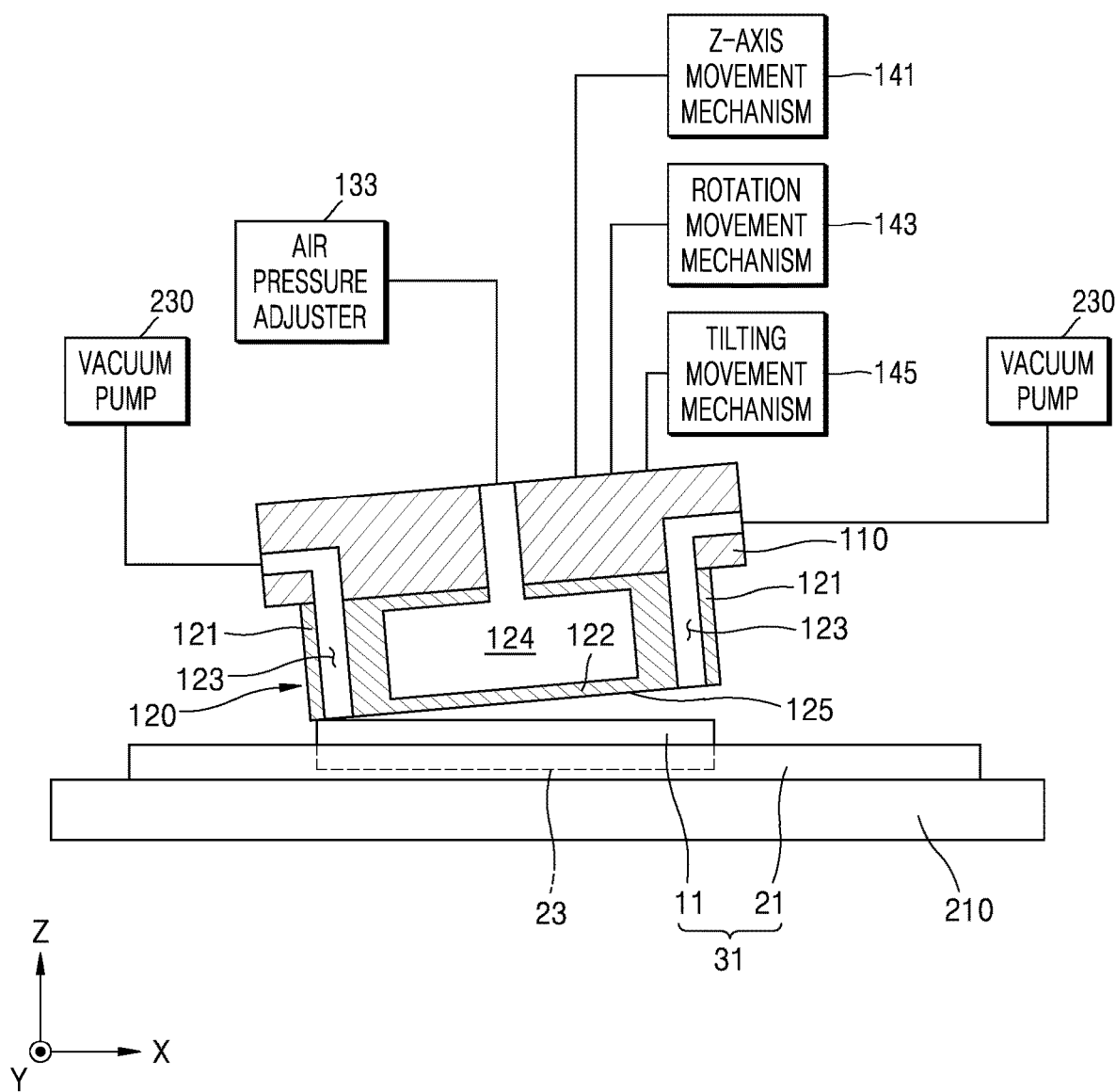

Referring to FIG. 5C, the bonding head 100 releases the vacuum adsorption on the semiconductor chip 11, such that the semiconductor chip 11 may be separated from the attachment pad 120. When the semiconductor chip 11 is separated from the attachment pad 120, the second edge of the bonding surface 12 of the semiconductor chip 11 may fall toward the bonding surface 22 of the substrate 21, and thus, a region near the second edge of the bonding surface 12 of the semiconductor chip 11 may be bonded to the bonding surface 22 of the substrate 21. When a region near the second edge of the bonding surface 12 of the semiconductor chip 11 is bonded to the bonding surface 22 of the substrate 21, the bonding between the semiconductor chip 11 and the substrate 21 is completed, and thus, the bonding structure 31 in which the semiconductor chip 11 is stacked on the chip 23 of the substrate 21 may be formed.

In some example embodiments, referring to FIGS. 5B and 5C, after the first edge of the bonding surface 12 of the semiconductor chip 11 contacts the substrate 21, vacuum adsorption on a portion adjacent to the first edge of the bonding surface 12 of the semiconductor chip 11 and vacuum adsorption on a portion adjacent to the second edge of the bonding surface 12 of the semiconductor chip 11 may be released at different times. For example, the vacuum adsorption on the portion adjacent to the first edge of the bonding surface 12 of the semiconductor chip 11 may be released first, and the vacuum adsorption on the portion adjacent to the second edge of the bonding surface 12 of the semiconductor chip 11 may be released later. Alternatively, in some example embodiments, the vacuum adsorption on the portion adjacent to the first edge of the bonding surface 12 of the semiconductor chip 11 and the vacuum adsorption on the portion adjacent to the second edge of the bonding surface 12 of the semiconductor chip 11 may be released simultaneously.

Figure 5D:
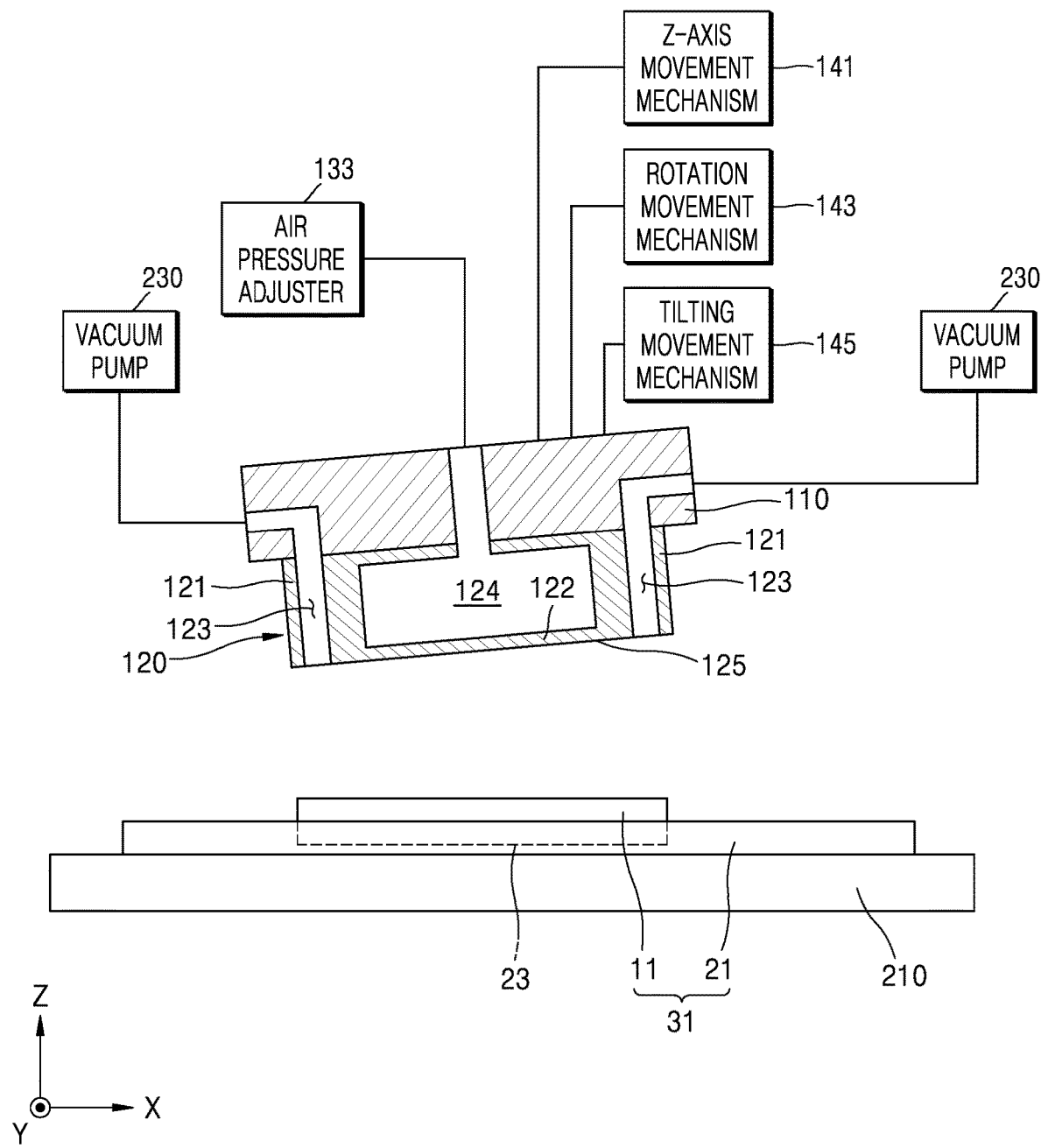

Referring to FIG. 5D, when the bonding between the semiconductor chip 11 and the substrate 21 is completed, the bonding head 100 moves upward away from the support 210. Thereafter, the bonding structure 31 is unloaded from the support 210.

According to example embodiments, when the semiconductor chip 11 and the substrate 21 are bonded to each other, the bonding region between the semiconductor chip 11 and the substrate 21 may be gradually propagated from the first edge of the bonding surface 12 of the semiconductor chip 11 toward the second edge of the bonding surface 12, and thus, a void may be discharged to the outside of the semiconductor chip 11 in the propagation direction PD2 (refer to FIG. 5B). Accordingly, in the bonding structure 31, a void does not remain at the interface between the semiconductor chip 11 and the substrate 21, and thus, the bonding reliability between the semiconductor chip 11 and the substrate 21 may be improved.

Figure 6A:
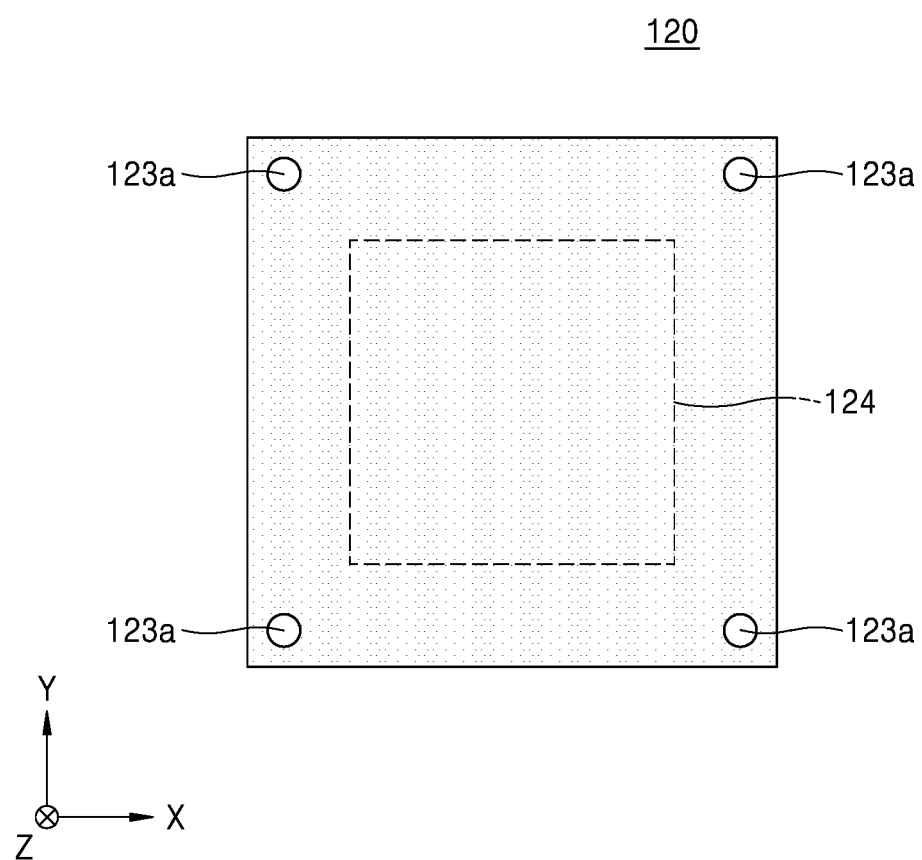
FIGS. 6A through 6C are bottom views of an attachment pad, showing a bottom surface of the attachment pad.
Figure 6B:
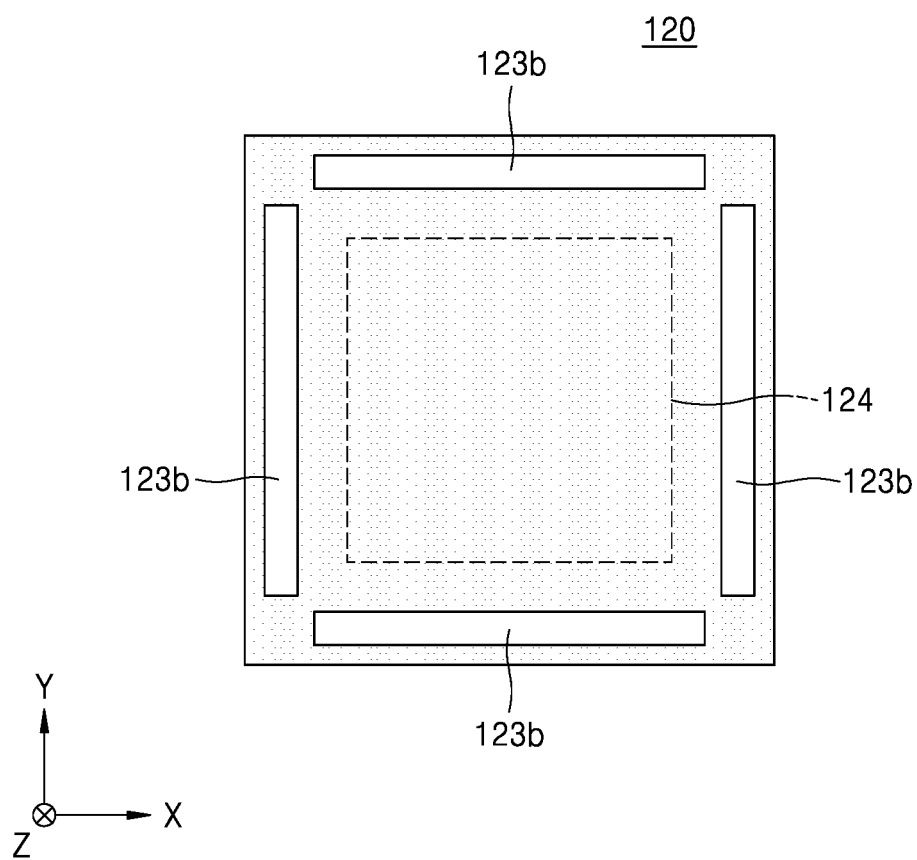
Figure 6C:
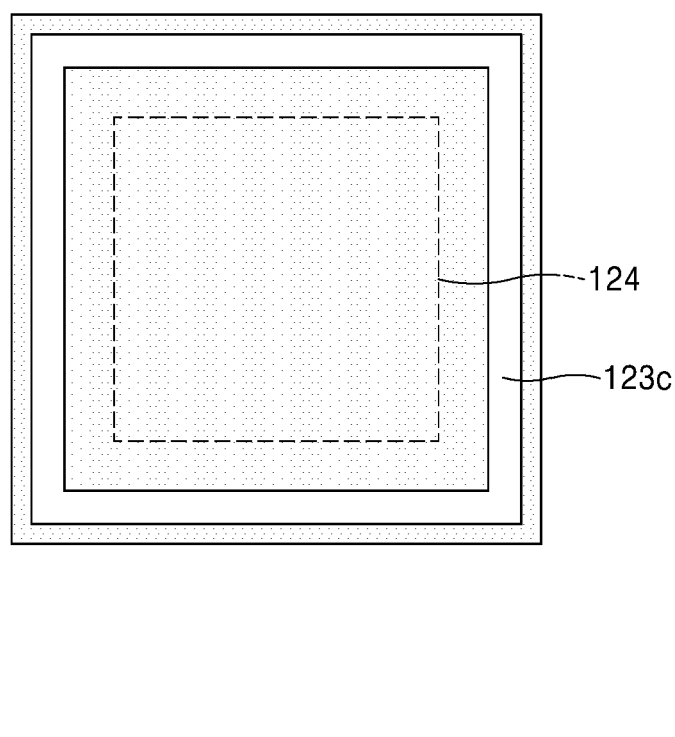

FIGS. 6A through 6C are bottom views of the attachment pad 120, showing the bottom surface 125 of the attachment pad 120.

Referring to FIGS. 1 and 6A, the attachment pad 120 may include a plurality of vacuum channels 123a spaced apart from one another. Each vacuum channel 123a may have a hole shape extending through the attachment pad 120. Because the vacuum channels 123a are spaced apart from one another, pressures applied to the vacuum channels 123a may be individually adjusted. For example, the vacuum pump 230 may individually adjust pressures applied to the vacuum channels 123a, thereby locally adjusting the adsorption force applied to the semiconductor chip 11 through the vacuum channels 123a.

Referring to FIGS. 1 and 6B, the attachment pad 120 may include a plurality of vacuum channels 123b spaced apart from one another. Each vacuum channel 123b may have a line shape extending along any one of the edges of the bottom surface 125 of the attachment pad 120. Because the vacuum channels 123b are spaced apart from each other, pressures applied to the vacuum channels 123b may be individually controlled. For example, the vacuum pump 230 may individually adjust pressures applied to the vacuum channels 123b, thereby locally adjusting the adsorption force applied to the semiconductor chip 11 through the vacuum channels 123b.

Referring to FIGS. 1 and 6C, the attachment pad 120 may include one vacuum channel 123c. The vacuum channel 123c may have a ring shape continuously extending along edges of the bottom surface 125 of the attachment pad 120. For example, the vacuum channel 123c may have a rectangular ring shape.

Figure 7:
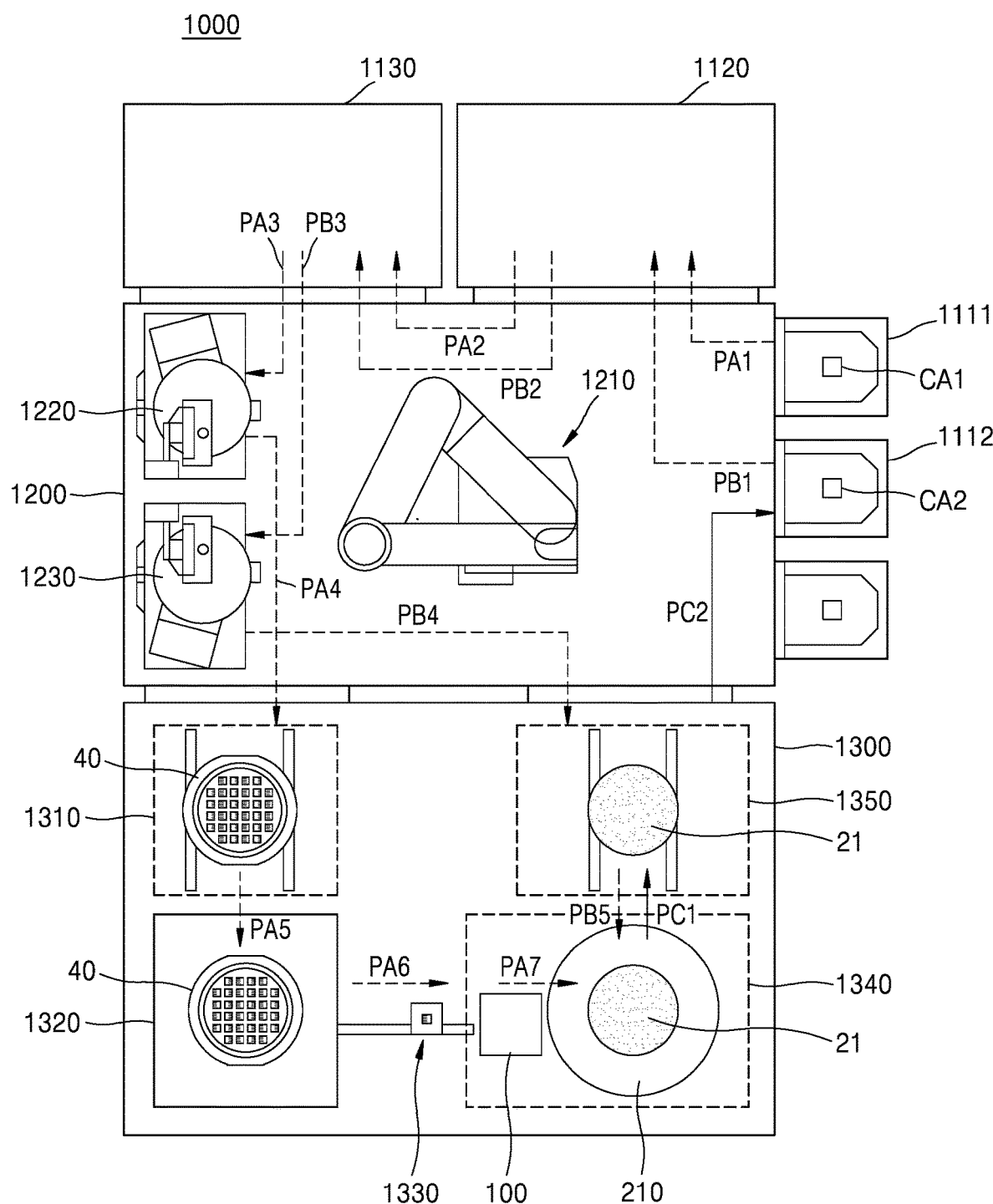
FIG. 7 is a schematic block diagram showing a semiconductor manufacturing apparatus according to example embodiments.
Figure 8:
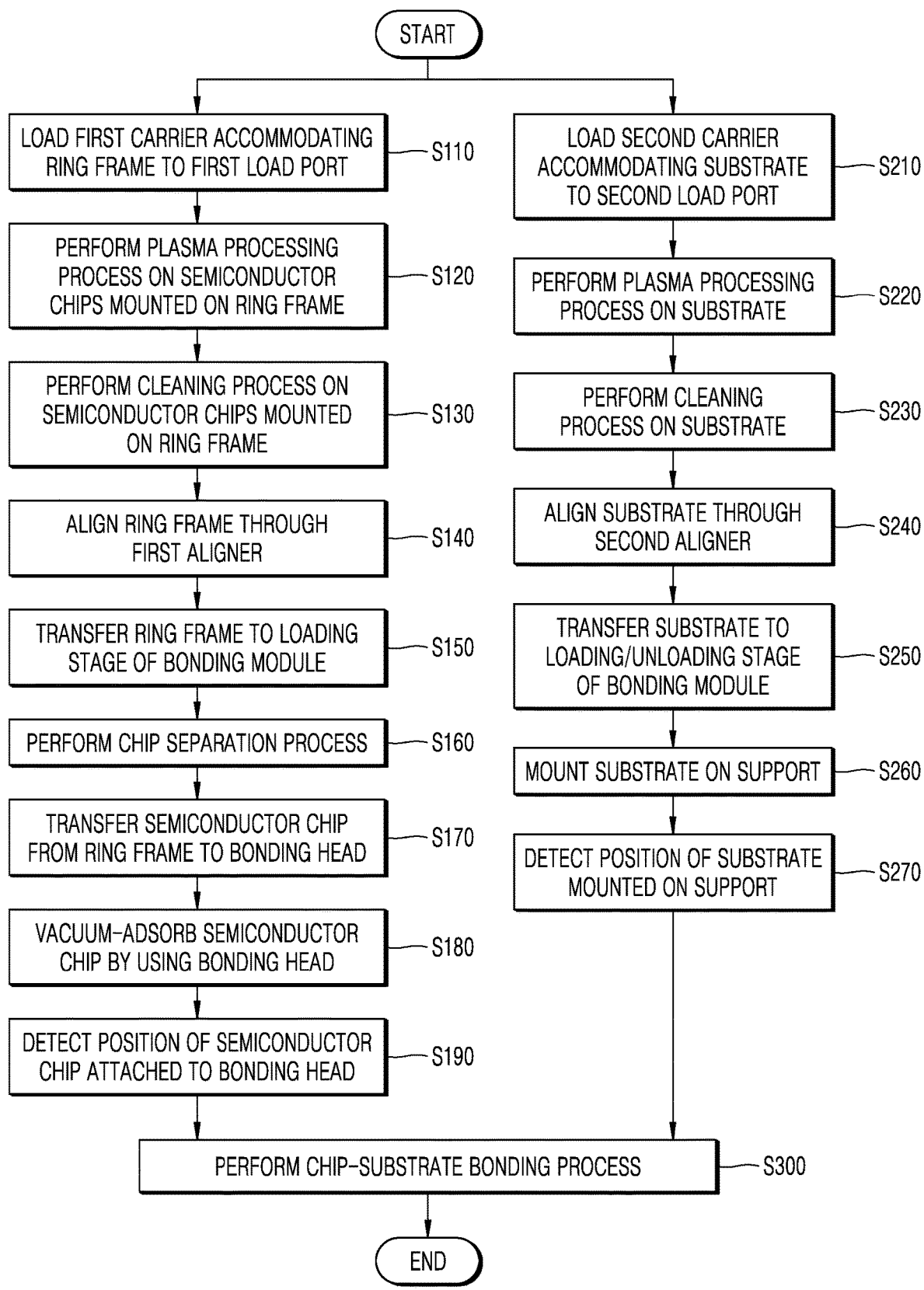
FIG. 8 is a flowchart of a semiconductor manufacturing method using the semiconductor manufacturing apparatus of FIG. 7.
Figure 9:
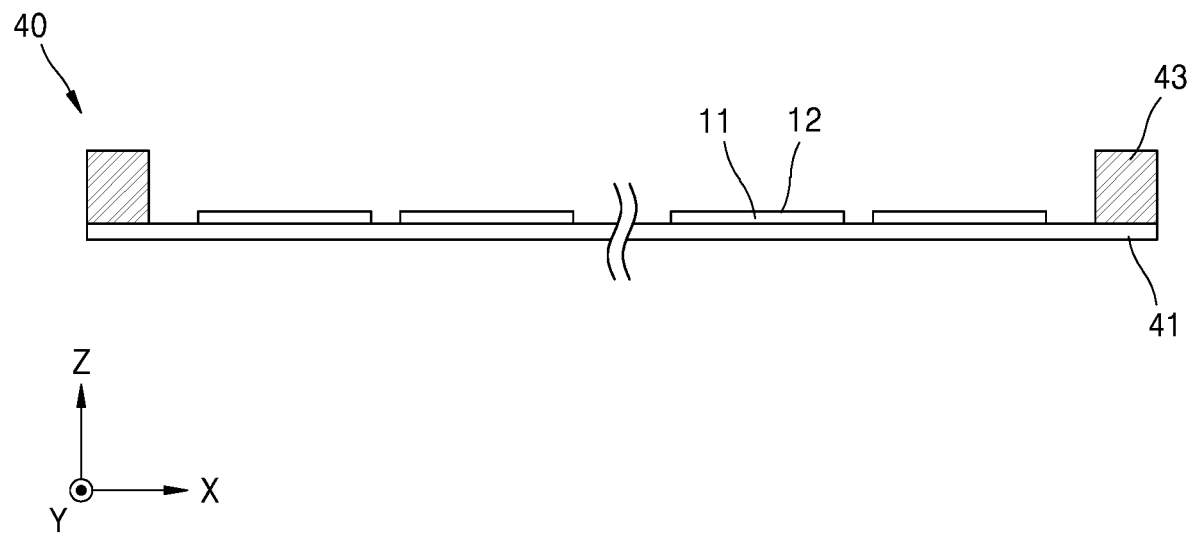
FIG. 9 is a cross-sectional view of a ring frame on which semiconductor chips are mounted.

FIG. 7 is a schematic block diagram showing a semiconductor manufacturing apparatus 1000 according to example embodiments. FIG. 8 is a flowchart of a semiconductor manufacturing method using the semiconductor manufacturing apparatus 1000 of FIG. 7. FIG. 9 is a cross-sectional view of a ring frame 40 on which semiconductor chips 11 are mounted.

Referring to FIGS. 7, 8, and 9, a first carrier CA1 in which the ring frame 40 having mounted thereon the semiconductor chips 11 is accommodated is loaded to a first load port 1111 (operation S110).

The first carrier CA1 may be, for example, a front opening unified pod (FOUP). The ring frame 40 may include an adhesive film 41 to which the semiconductor chips 11 are attached and a ring-shaped frame body 43 coupled to edges of the adhesive film 41.

The ring frame 40 is transferred from the first carrier CA1 to a plasma processing module 1120, and the plasma processing module 1120 performs a plasma processing process on the semiconductor chips 11 mounted on the ring frame 40 (operation S120).

In operation S120, the ring frame 40 may be transferred by a transfer robot 1210 included in an equipment front end module (EFEM) 1200. For example, as indicated by a first chip transfer path PA1 shown in FIG. 7, the transfer robot 1210 may unload the ring frame 40 from the first carrier CA1 and transfer the ring frame 40 unloaded from the first carrier CA1 to the plasma processing module 1120.

In operation S120, the plasma processing module 1120 may include a chamber providing a plasma processing space and a plasma generator for generating plasma. The plasma processing module 1120 may perform plasma processing on the bonding surface 12 of the semiconductor chip 11, such that the bonding surface 12 of the semiconductor chip 11 has a bonding force suitable for performing a bonding process.

When a plasma processing for the semiconductor chips 11 is completed, the ring frame 40 is transferred to a cleaning module 1130, and the cleaning module 1130 performs a cleaning process for the semiconductor chips 11 mounted on the ring frame 40 (operation S130).

In operation S130, the ring frame 40 may be transferred by the transfer robot 1210 included in the EFEM 1200. For example, the transfer robot 1210 may transfer the ring frame 40 from the plasma processing module 1120 to the cleaning module 1130, as indicated by a second chip transfer path PA2 shown in FIG. 7.

In operation S130, the cleaning module 1130 may perform wet cleaning on the semiconductor chips 11. The cleaning module 1130 may include a chamber providing a cleaning space and a cleaning fluid spray nozzle supplying a cleaning fluid used for wet cleaning. The cleaning module 1130 may spray a cleaning fluid including deionized water onto the semiconductor chips 11 to clean contaminants remaining on surfaces of the semiconductor chips 11.

When the cleaning process on the semiconductor chips 11 is completed, the ring frame 40 is transferred to a first aligner 1220 included in the EFEM 1200, and the first aligner 1220 aligns the ring frame 40 in a predetermined direction (operation S140). In operation S140, the transfer robot 1210 may transfer the ring frame 40 from the cleaning module 1130 to the first aligner 1220, as indicated by the third chip transfer path PA3 shown in FIG. 7.

Thereafter, the ring frame 40 is transferred from the first aligner 1220 to a loading stage 1310 of a bonding module 1300 (operation S150). In operation S150, the transfer robot 1210 may transfer the ring frame 40 from the first aligner 1220 toward the loading stage 1310 of the bonding module 1300, as indicated by a fourth chip transfer path PA4 shown in FIG. 7. The loading stage 1310 may include a transfer unit for transferring the ring frame 40.

Figure 10A:
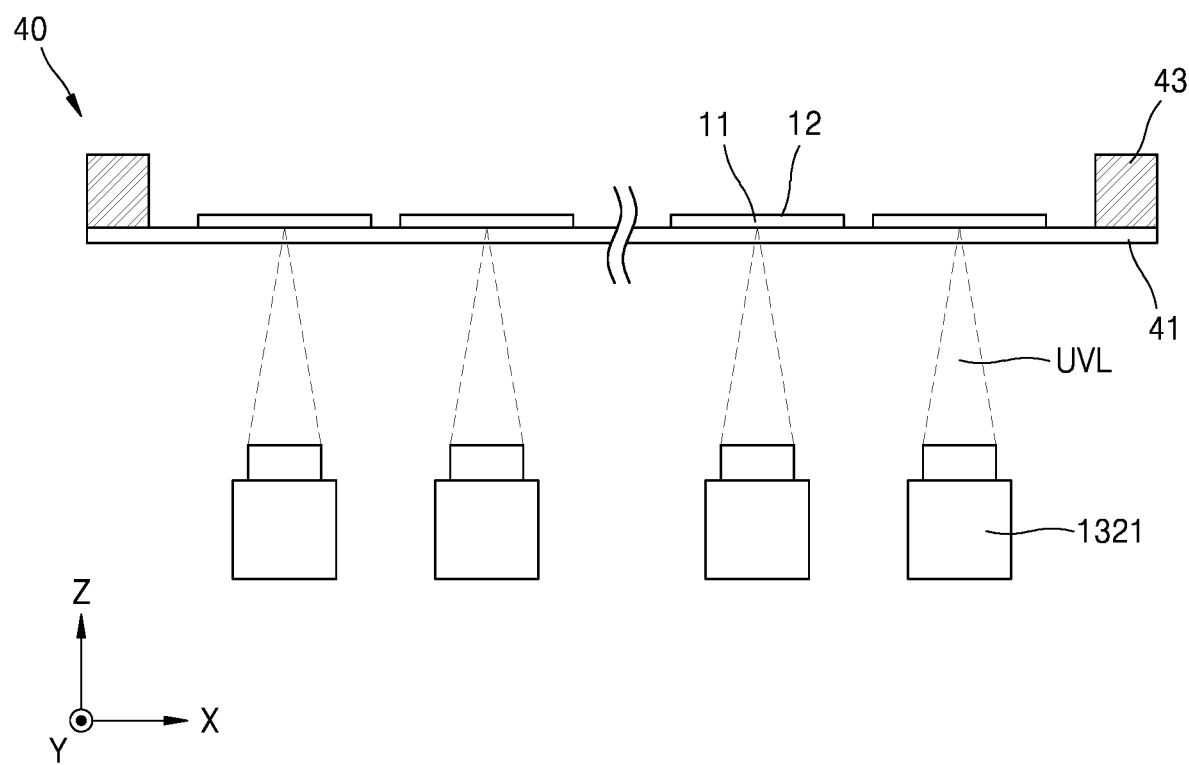
FIGS. 10A through 10C are conceptual diagrams showing a chip separation process performed at a chip separation stage of a bonding module according to example embodiments of the inventive concept.
Figure 10B:
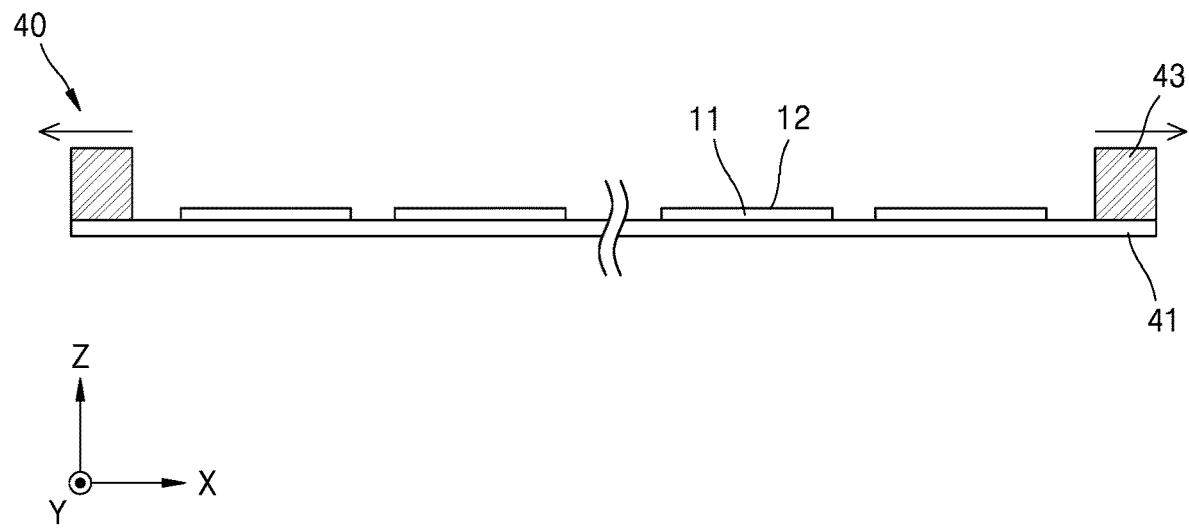
Figure 10C:
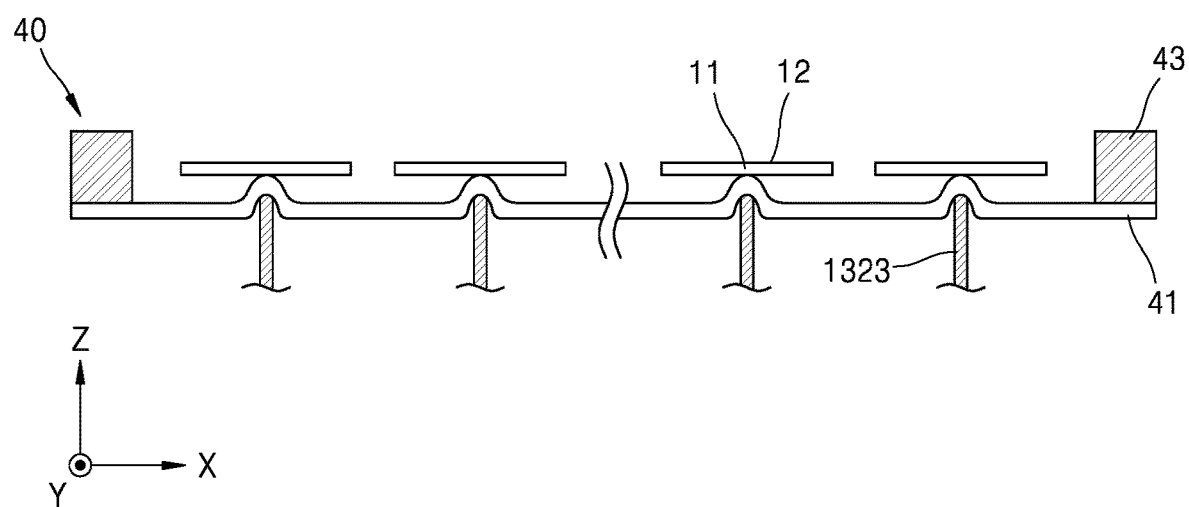

FIGS. 10A through 10C are conceptual diagrams showing a chip separation process performed at a chip separation stage 1320 of the bonding module 1300 according to example embodiments of the inventive concept.

Referring to FIGS. 7, 8, 10A, 10B, and 10C, the ring frame 40 is transferred from the loading stage 1310 to the chip separation stage 1320 along a fifth chip transfer path PA5 shown in FIG. 7, and the chip separation stage 1320 performs a chip separation process for separating the semiconductor chip 11 from the ring frame 40 (operation S160).

In operation S160, the chip separation process may include various processes for reducing an adhesive force of the adhesive film 41 of the ring frame 40 to allow the semiconductor chip 11 to be easily separated from the adhesive film 41. In example embodiments, the chip separation process performed by the chip separation stage 1320 may include an ultraviolet (UV) irradiation process, a film expanding process, and a chip ejecting process.

FIG. 10A is a diagram showing a UV irradiation process performed on the chip separation stage 1320. The chip separation stage 1320 may include a UV light source 1321 configured to irradiate UV light UVL onto the adhesive film 41 of the ring frame 40. The UV light source 1321 may locally reduce the adhesive force of the adhesive film 41 by irradiating the UV light UVL onto regions of the adhesive film 41 to which the semiconductor chips 11 are attached.

FIG. 10B is a diagram showing a film expanding process performed on the chip separation stage 1320. The chip separation stage 1320 may include an expanding tool configured to pull the frame body 43 outwardly in a radial direction to expand the adhesive film 41. The expanding tool may expand the adhesive film 41 to increase a distance between the semiconductor chips 11 to a level demanded for a subsequent process for picking up the semiconductor chip 11.

FIG. 10C is a diagram showing a chip ejecting process performed at the chip separation stage 1320. The chip separation stage 1320 may include an ejector 1323 configured to physically press the adhesive film 41. The ejector 1323 is a pin-shaped member or a bar-shaped member connected to a driving unit like an actuator and may upwardly press the bottom surface opposite to the top surface of the adhesive film 41 to which the semiconductor chip 11 is attached, thereby pushing the semiconductor chip 11 upward. For example, the ejector 1323 may be a pin or a bar. For example, the ejector 1323 may lift the semiconductor chip 11 while moving upward from below the center of the semiconductor chip 11. When the semiconductor chip 11 pressed by the ejector 1323 is lifted, an adhesive region between the semiconductor chip 11 and the adhesive film 41 is reduced, and thus, an adhesive force between the semiconductor chip 11 and the adhesive film 41 may be reduced.

Figure 11A:
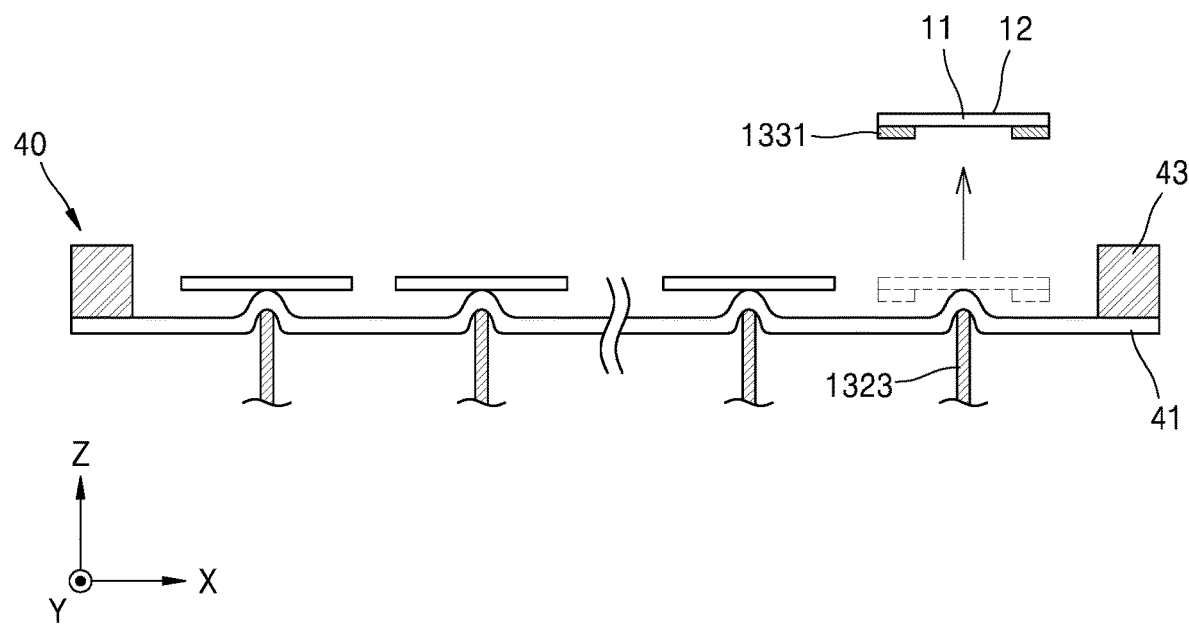
FIGS. 11A through 11C are conceptual diagrams showing a process of transferring a semiconductor chip by using a chip transfer module of a bonding module according to example embodiments.
Figure 11B:
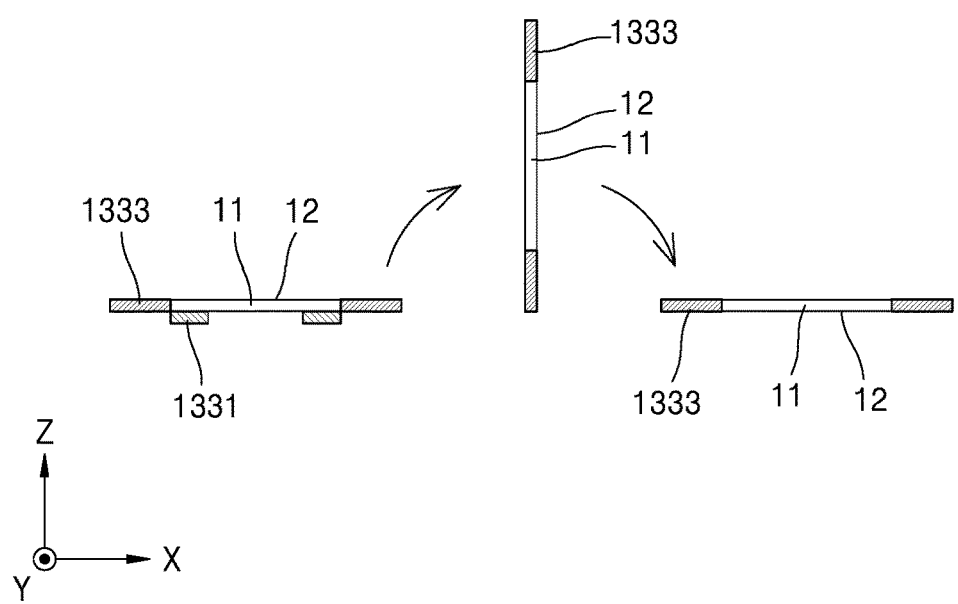
Figure 11C:
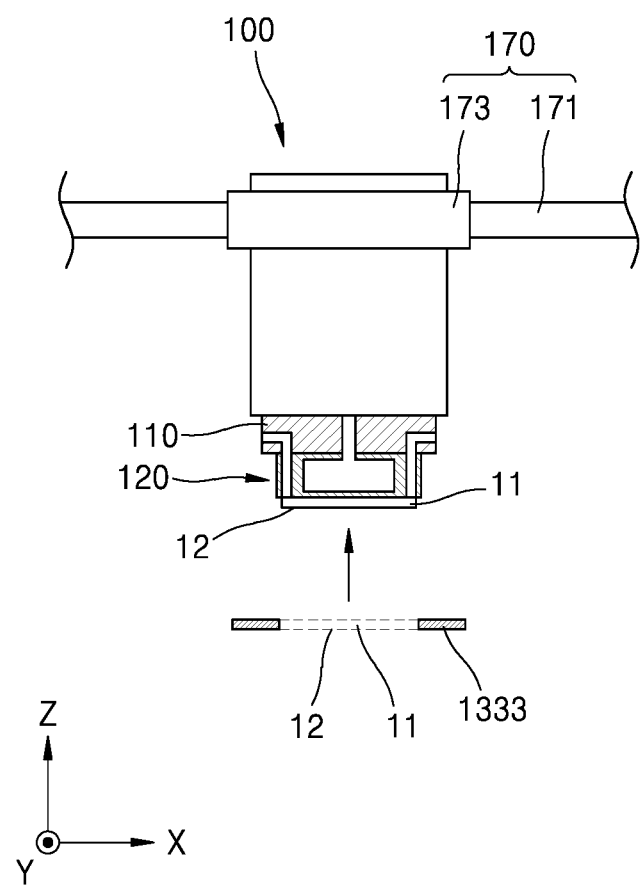

FIGS. 11A through 11C are conceptual diagrams showing a process of transferring the semiconductor chip 11 by using a chip transfer module 1330 of the bonding module 1300 according to example embodiments.

Referring to FIGS. 7, 8, 11A, 11B, and 11C, the chip transfer module 1330 picks up the semiconductor chip 11 placed on the ring frame 40 and transfers the semiconductor chip 11 from the chip separation stage 1320 to the bonding head 100 provided at the bonding stage 1340 along a sixth chip transfer path PA6 shown in FIG. 7 (operation S170).

As shown in FIG. 11A, a first gripper 1331 included in the chip transfer module 1330 picks up the semiconductor chip 11 placed on the adhesive film 41 of the ring frame 40 and separates the semiconductor chip 11 from the adhesive film 41. The first gripper 1331 is configured to support a semiconductor chip. To prevent deterioration of the adhesion of the bonding surface 12 of a semiconductor chip 11 that is plasma treated, the first gripper 1331 may support the semiconductor chip 11 while not contacting the bonding surface 12 of the semiconductor chip 11. For example, the first gripper 1331 may support a surface of the semiconductor chip 11 opposite to the bonding surface 12.

Next, as shown in FIG. 11B, a second gripper 1333 may receive the semiconductor chip 11 from the first gripper 1331 and rotate such that the bonding surface 12 of the semiconductor chip 11 faces downward. For example, the second gripper 1333 may rotate the semiconductor chip 11 by 180 degrees around a rotation axis extending in the Y direction while supporting the semiconductor chip 11. To prevent deterioration of the adhesion of the bonding surface 12 of a semiconductor chip 11 that is plasma treated, the second gripper 1333 may support the semiconductor chip 11 while not contacting the bonding surface 12 of the semiconductor chip 11. For example, the second gripper 1333 may support a side surface of the semiconductor chip 11.

Next, as shown in FIG. 11C, the bonding head 100 may receive the semiconductor chip 11 from the second gripper 1333 and vacuum-adsorb the semiconductor chip 11(operation S180). When the semiconductor chip 11 is attached to the attachment pad 120, a surface of the semiconductor chip 11 opposite to the bonding surface 12 may be attached to and/or contact the attachment pad 120.

Figure 12:
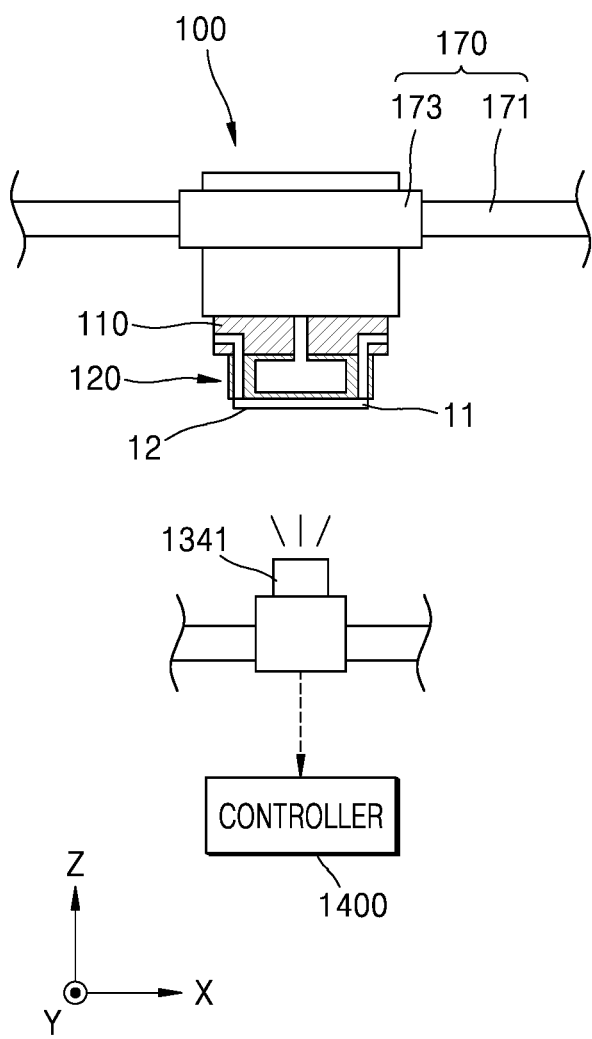
FIG. 12 is a conceptual diagram showing a process of detecting a position of a semiconductor chip attached to a bonding head by using a first image capturing device according to example embodiments.

FIG. 12 is a conceptual diagram showing a process of detecting a position of the semiconductor chip 11 attached to the bonding head 100 by using a first image capturing device 1341 according to example embodiments.

Referring to FIGS. 7, 8, and 12, a position of the semiconductor chip 11 attached to the bonding head 100 is detected by using the first image capturing device 1341 (operation S190).

The first image capturing device 1341 may include an image sensor. The first image capturing device 1341 may transmit an image signal obtained by capturing an image of the semiconductor chip 11 attached to the attachment pad 120 of the bonding head 100 to the controller 1400. The controller 1400 may include an image processor 1410 (refer to FIG. 15) configured to process an image signal obtained by the first image capturing device 1341.

The controller 1400 may detect the position of the semiconductor chip 11 based on an image signal obtained by the first image capturing device 1341. For example, the controller 1400 may detect a relative position of the semiconductor chip 11 with respect to a predetermined reference position. In example embodiments, a controller 1400 may detect a relative position of the semiconductor chip 11 on an XY plane (hereinafter, referred to as an XY relative position of the semiconductor chip 11) and a relative position of the semiconductor chip 11 in a rotational direction.

When an image of the semiconductor chip 11 is captured by the first image capturing device 1341 in a state in which the semiconductor chip 11 is forcibly deformed, a surface of the semiconductor chip 11 is convexly deformed, and thus, it is difficult to precisely detect a position of the semiconductor chip 11. Therefore, while an image of the semiconductor chip 11 attached to the attachment pad 120 is being captured by using the first image capturing device 1341, the bonding head 100 may maintain the bottom surface 125 of the attachment pad 120 in a flat state (e.g., the initial state of the attachment pad 120).

Referring back to FIGS. 7 and 8, a second carrier CA2 in which the substrate 21 is accommodated is loaded to a second load port 1112 (operation S210). The second carrier CA2 may be, for example, a FOUP. The substrate 21 may be a wafer including a plurality of chips.

Next, the substrate 21 is transferred from the second carrier CA2 to the plasma processing module 1120, and the plasma processing module 1120 performs a plasma processing process on the substrate 21 (operation S220).

In operation S220, the substrate 21 may be transferred by the transfer robot 1210 included in the EFEM 1200. For example, as indicated by a first substrate transfer path PB1 shown in FIG. 7, the transfer robot 1210 may carry the substrate 21 out of the second carrier CA2 and transfer the substrate 21 carried out of the second carrier CA2 to the plasma processing module 1120. In operation S220, the plasma processing module 1120 may perform a plasma processing on the bonding surface 22 of the substrate 21 such that the bonding surface 22 of the substrate 21 has a bonding force suitable for performing a bonding process.

Although FIG. 7 shows that the substrate 21 and the ring frame 40 are plasma-processed in the same plasma processing module 1120, a plasma processing process for the substrate 21 and a plasma processing process for the ring frame 40 may be performed in different plasma processing modules in certain embodiments.

When the plasma processing process on the substrate 21 is completed, the substrate 21 is transferred to the cleaning module 1130, and the cleaning module 1130 performs a cleaning process on the substrate 21 (operation S230). In operation S230, the transfer robot 1210 may transfer the substrate 21 from the plasma processing module 1120 to the cleaning module 1130, as indicated by a second substrate transfer path PB2 shown in FIG. 7. In operation S230, the cleaning module 1130 may spray a cleaning fluid onto the substrate 21 to clean contaminants remaining on a surface of the substrate 21.

Although FIG. 7 shows that the substrate 21 and the ring frame 40 are cleaned in the same cleaning module 1130, a cleaning process for the substrate 21 and a cleaning process for the ring frame 40 may be performed in different cleaning modules in certain embodiments.

When the cleaning process on the substrate 21 is completed, the substrate 21 is transferred to a second aligner 1230 included in the EFEM 1200, and the second aligner 1230 aligns the substrate 21 in a predetermined direction (operation S240). In operation S240, the transfer robot 1210 may transfer the substrate 21 from the cleaning module 1130 to the second aligner 1230, as indicated by a third substrate transfer path PB3 shown in FIG. 7.

Thereafter, the substrate 21 is transferred from the second aligner 1230 to a loading/unloading stage 1350 of the bonding module 1300 (operation S250). In operation S250, the transfer robot 1210 may transfer the substrate 21 from the second aligner 1230 toward the loading/unloading stage 1350 of the bonding module 1300, as indicated by a fourth substrate transfer path PB4 shown in FIG. 7. The loading/unloading stage 1350 may include a transfer unit for transferring the substrate 21.

Thereafter, the loading/unloading stage 1350 may transfer the substrate 21 loaded thereto to the support 210 of the bonding stage 1340 (operation S260). The substrate 21 may be transferred from the loading/unloading stage 1350 to the bonding stage 1340 along a fifth substrate transfer path PB5 shown in FIG. 7, and may be mounted on the main surface 211 of the support 210. The support 210 may be, for example, a chuck configured to support the substrate 21 using a vacuum or an electrostatic force.

FIG. 13 is a conceptual diagram showing a process of detecting a position of the substrate 21 by using a second image capturing device 1343 according to example embodiments.

Referring to FIGS. 7, 8, and 13, a position of the substrate 21 mounted on the support 210 is detected by using the second image capturing device 1343 (operation S270).

The second image capturing device 1343 may include an image sensor. The second photographing device 1343 may transmit an image signal obtained by capturing an image of the substrate 21 mounted on the support 210 to the controller 1400.

The controller 1400 may detect a position of the substrate 21 or a position of the chip 23 included in the substrate 21 based on the image signal obtained by the second image capturing device 1343. For example, the controller 1400 may detect a relative position of the substrate 21 with respect to a predetermined reference position. In example embodiments, the controller 1400 may detect a relative position of the substrate 21 on an XY plane (hereinafter, referred to as an XY relative position of the substrate 21) and a relative position of the substrate 21 in a rotational direction.

Referring to FIGS. 7 and 8, the semiconductor chip 11 is transferred above the support 210 of the bonding stage 1340 by using the bonding head 100 to align the semiconductor chip 11 with the chip of the substrate 21, and then the semiconductor chip 11 and the substrate 21 are bonded to each other (operation S300). The bonding head 100 may transfer the semiconductor chip 11 to a position aligned with a chip of the substrate 21 mounted on the support 210 along a seventh chip transfer path PA7 shown in FIG. 7. The bonding stage 1340 may include a chip stacking device that stacks the semiconductor chip 11 on the substrate 21. In operation S300, the bonding between the semiconductor chip 11 and the substrate 21 may be performed using the chip-substrate bonding method described above with reference to FIGS. 4A through 4E or the chip-substrate bonding method described above with reference to FIGS. 5A through 5D.

Figure 14:
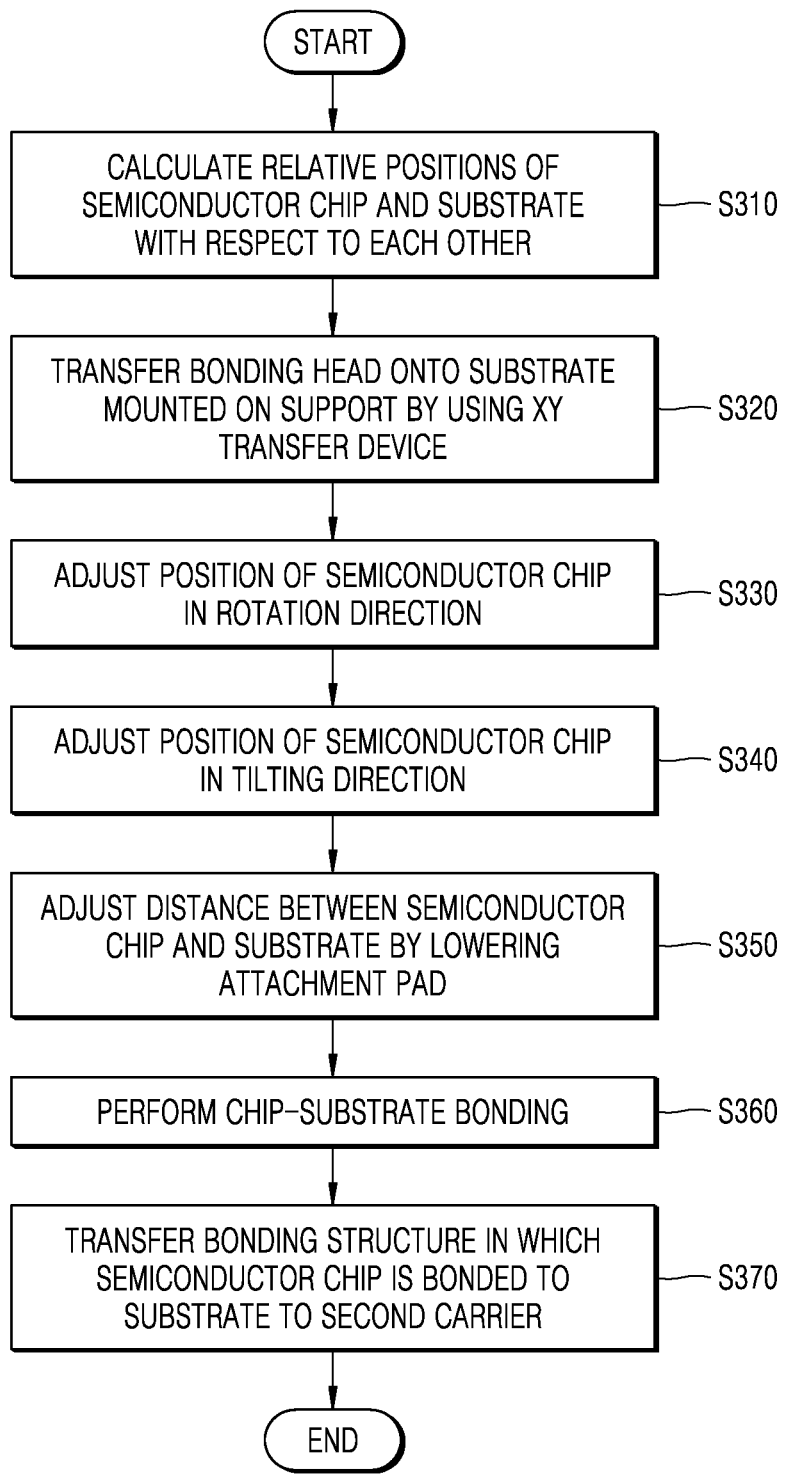
FIG. 14 is a flowchart of a chip-substrate bonding method using the semiconductor manufacturing apparatus of FIG. 7 according to example embodiments of the inventive concept.
Figure 15:
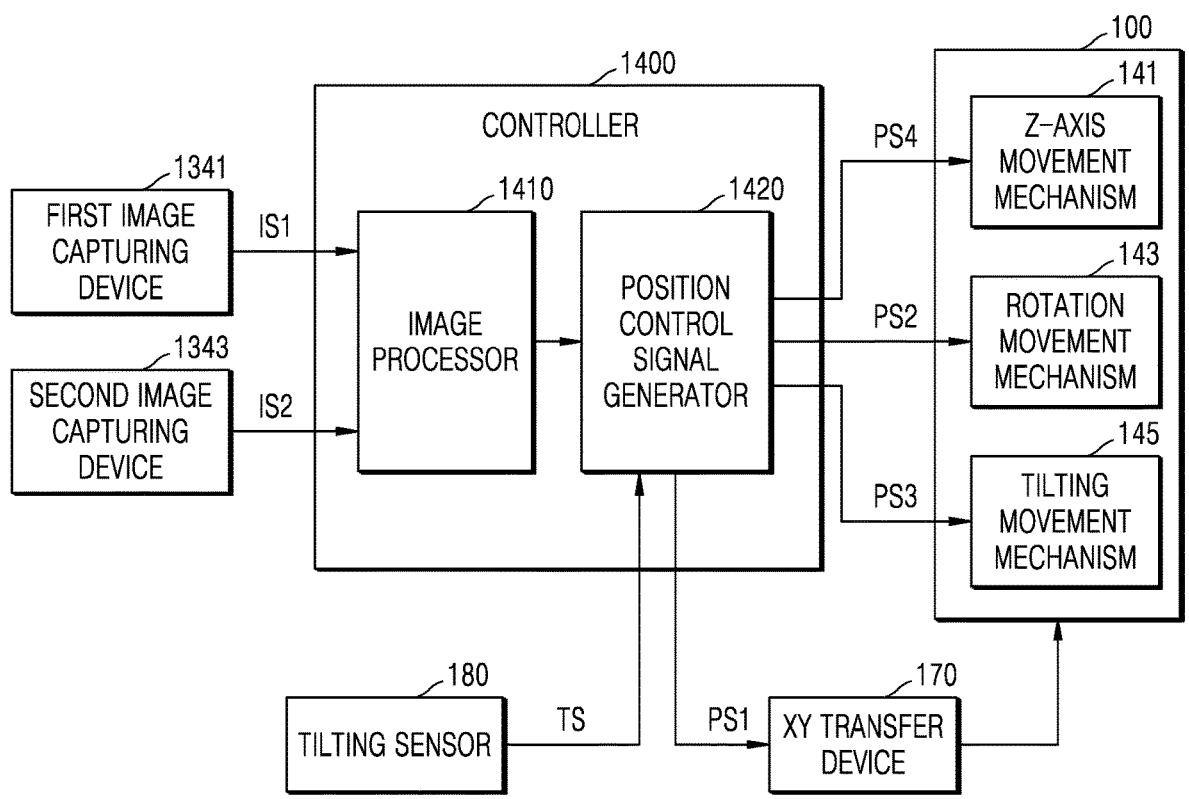
FIG. 15 is a block diagram showing a bonding module according to example embodiments.

FIG. 14 is a flowchart of a chip-substrate bonding method using the semiconductor manufacturing apparatus 1000 of FIG. 7 according to example embodiments of the inventive concept. FIG. 15 is a block diagram showing a bonding module 1300, e.g., including a first image capturing device 1341 and a second image capturing device 1343, according to example embodiments. FIGS. 16A through 16E are conceptual diagrams showing a chip-substrate bonding method using the semiconductor manufacturing apparatus 1000 of FIG. 7.

Figure 16A:
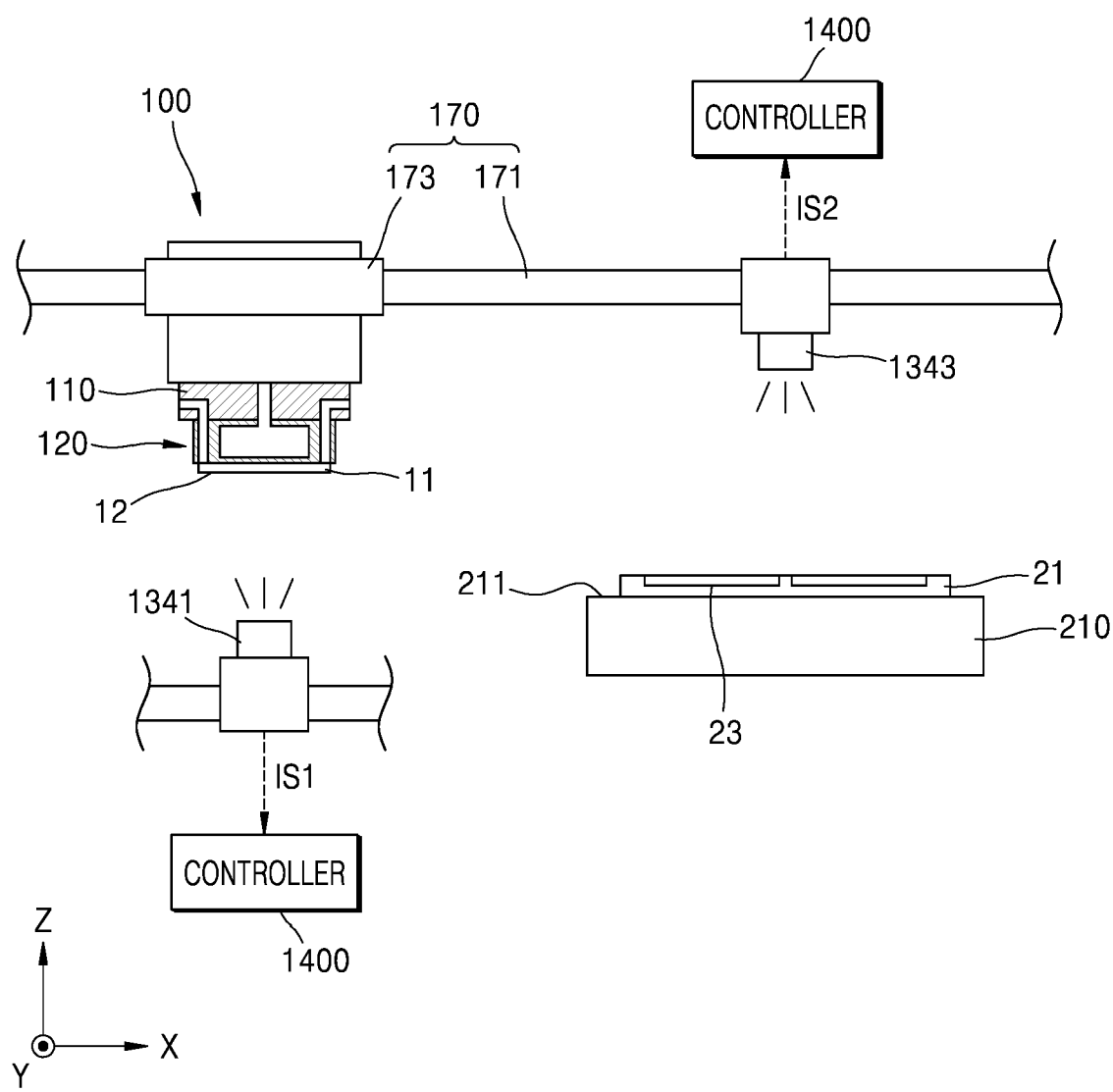
FIGS. 16A through 16E are conceptual diagrams showing a chip-substrate bonding method using the semiconductor manufacturing apparatus of FIG. 7.

Referring to FIGS. 14, 15, and 16A, relative positions of the semiconductor chip 11 and the substrate 21 with respect to each other are calculated (operation S310).

In example embodiments, the image processor 1410 of the controller 1400 may process an image signal IS1 transmitted from the first image capturing device 1341 and an image signal IS2 transmitted from the second image capturing device 1343 and calculate relative positions of the semiconductor chip 11 and the substrate 21 with respect to each other. For example, the image processor 1410 of the controller 1400 may calculate relative positions of the semiconductor chip 11 and the chip 23 of the substrate 21 to be bonded to the semiconductor chip 11 with respect to each other. Here, the relative positions of the semiconductor chip 11 and the substrate 21 with respect to each other may include relative positions in the X direction, relative positions in the Y direction, and relative positions in a rotational direction.

The controller 1400 may determine a target position to which the semiconductor chip 11 and the chip 23 of the substrate 21 are aligned, based on information regarding calculated relative positions of the semiconductor chip 11 and the substrate 21 with each other. Here, the target position may refer to a position where the semiconductor chip 11 and the chip 23 of the substrate 21 are aligned in the X direction, the Y direction, and the rotational direction. For example, the controller 1400 may determine a target position to which the semiconductor chip 11 and the chip 23 of the substrate 21 are aligned on an XY plane (hereinafter, referred to as a target XY position) and a target position at which the semiconductor chip 11 is aligned with the chip 23 of the substrate 21 in the rotational direction (hereinafter, referred to as a target rotational position).

A position control signal generator 1420 of the controller 1400 may generate a position control signal for transferring the semiconductor chip 11 to a target position based on a signal transmitted from the image processor 1410. The position control signal generator 1420 may generate a first position signal PS1 for positioning the semiconductor chip 11 at the target XY position and a second position signal PS2 for positioning the semiconductor chip 11 at the target rotational position.

The position control signal generator 1420 may include at least one processor configured to perform a predetermined operation and a predetermined algorithm. For example, the at least one processor may include a microprocessor, a CPU, etc.

Figure 16B:
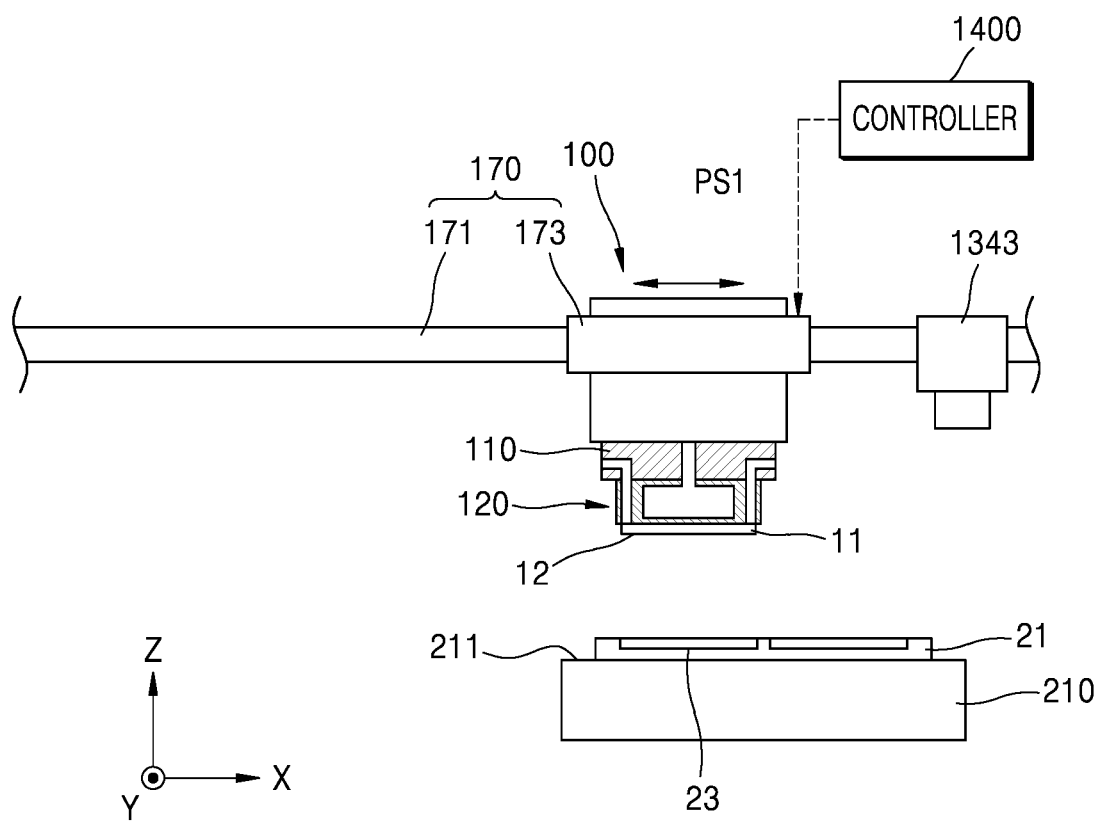

Referring to FIGS. 14, 15, and 16B, the bonding head 100 is transferred above the substrate 21 mounted on the support 210 by using an XY transfer device 170 (operation S320).

The XY transfer device 170 may be implemented, for example, by a linear motion module or gantry system configured to linearly move the bonding head 100. For example, the XY transfer device 170 may include a moving rail 171 extending in the X direction and/or the Y direction and a moving block 173 that is coupled to the bonding head 100 and configured to move along the moving rail 171. The moving block 173 is connected to an actuator and may be linearly moved along the moving rail 171 by the actuator. The bonding head 100 may move on the XY plane by the linear movement of the moving block 173.

In operation S320, the position control signal generator 1420 may apply the first position signal PS1 for transferring the semiconductor chip 11 to the target XY position to the XY transfer device 170. The XY transfer device 170 may move the bonding head 100 based on the first position signal PS1 and position the semiconductor chip 11 at the target XY position.

Figure 16C:
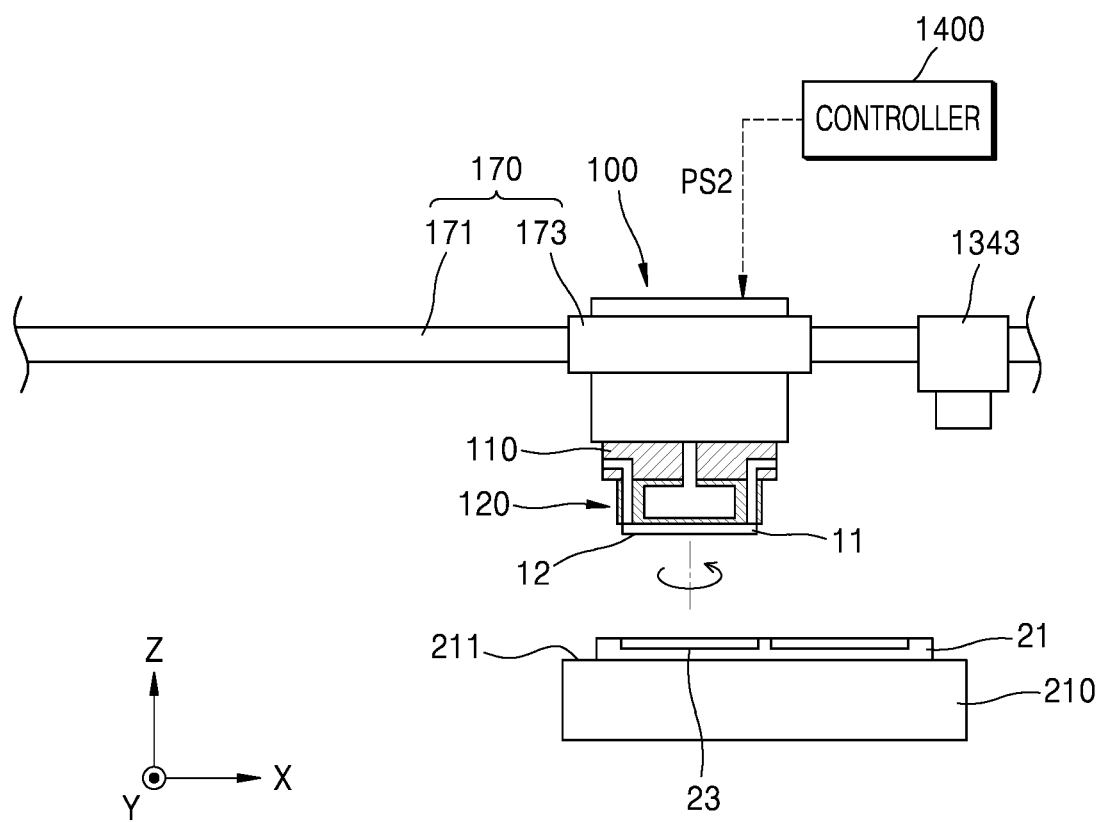

Referring to FIGS. 14, 15, and 16C, the bonding head 100 may adjust the position of the semiconductor chip 11 in the rotational direction by using the rotation movement mechanism 143 (operation S330).

In operation S330, the position control signal generator 1420 may apply the second position signal PS2 for positioning the semiconductor chip 11 at the target rotational position to the rotation movement mechanism 143. The rotation movement mechanism 143 may rotate the attachment pad 120 based on the second position signal PS2 around a rotation axis extending in a direction perpendicular to the main surface 211 of the support 210 and position the semiconductor chip 11 at the target rotational position.

Figure 16D:
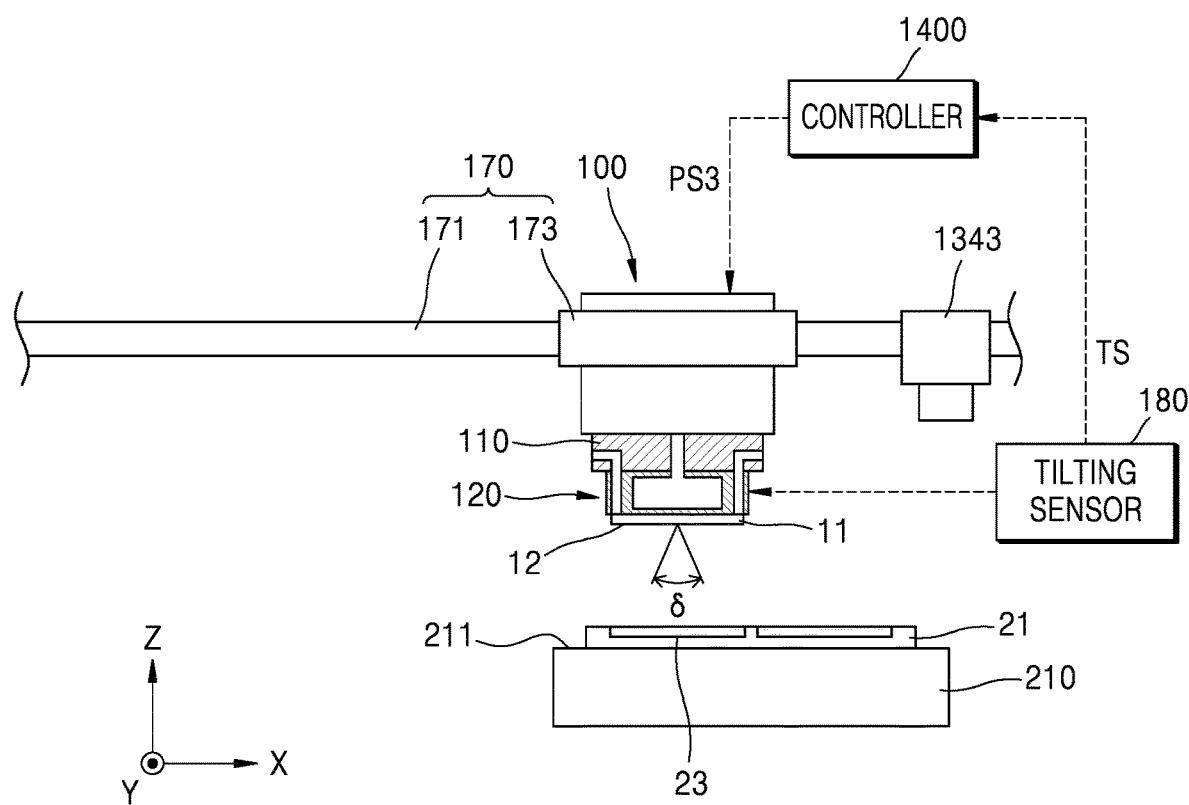

Referring to FIGS. 14, 15, and 16D, the bonding head 100 may adjust a position of the semiconductor chip 11 in a tilting direction by using the tilting movement mechanism 145 (operation S340).

In operation S340, a tilting sensor 180 may sense a position of the semiconductor chip 11 in the tilting direction. For example, the tilting sensor 180 may be configured to sense a position of the attachment pad 120 or a position of a structure (e.g., the base 110) to which the attachment pad 120 is coupled in the tilting direction. The position of the attachment pad 120 or the position of the structure (e.g., the base 110) to which the attachment pad 120 is coupled in the tilting direction detected by the tilting sensor 180 may be used to detect the position of the semiconductor chip 11 attached to the attachment pad 120 in the tilting direction.

In operation S340, the controller 1400 may determine a target position (hereinafter, referred to as a target tilting position) in the tilting direction of the semiconductor chip 11 based on a detection signal TS regarding a position of the semiconductor chip 11 detected by the tilting sensor 180 in the tilting direction.

The position control signal generator 1420 may generate a third position signal PS3 for positioning the semiconductor chip 11 at the target tilting position and may apply the third position signal PS3 to the tilting movement mechanism 145. The tilting movement mechanism 145 may tilt the attachment pad 120 based on the third position signal PS3 around a tilting axis extending in a direction (e.g., the X direction or the Y direction) parallel to the main surface 211 of the support 210, thereby positioning the semiconductor chip 11 at the target tilting position.

In example embodiments, the target tilting position may be a position where the bonding surface 12 of the semiconductor chip 11 and the bonding surface 22 of the substrate 21 are parallel to each other. Alternatively, as shown in FIGS. 5A through 5D, when the bonding between the semiconductor chip 11 and the substrate 21 is performed in a direction from the first edge of the semiconductor chip 11 toward the second edge of the semiconductor chip 11, the target tilting position may be a position inclined at a predetermined angle with respect to the bonding surface 12 of the semiconductor chip 11 and/or the bonding surface 22 of the substrate 21.

Figure 16E:
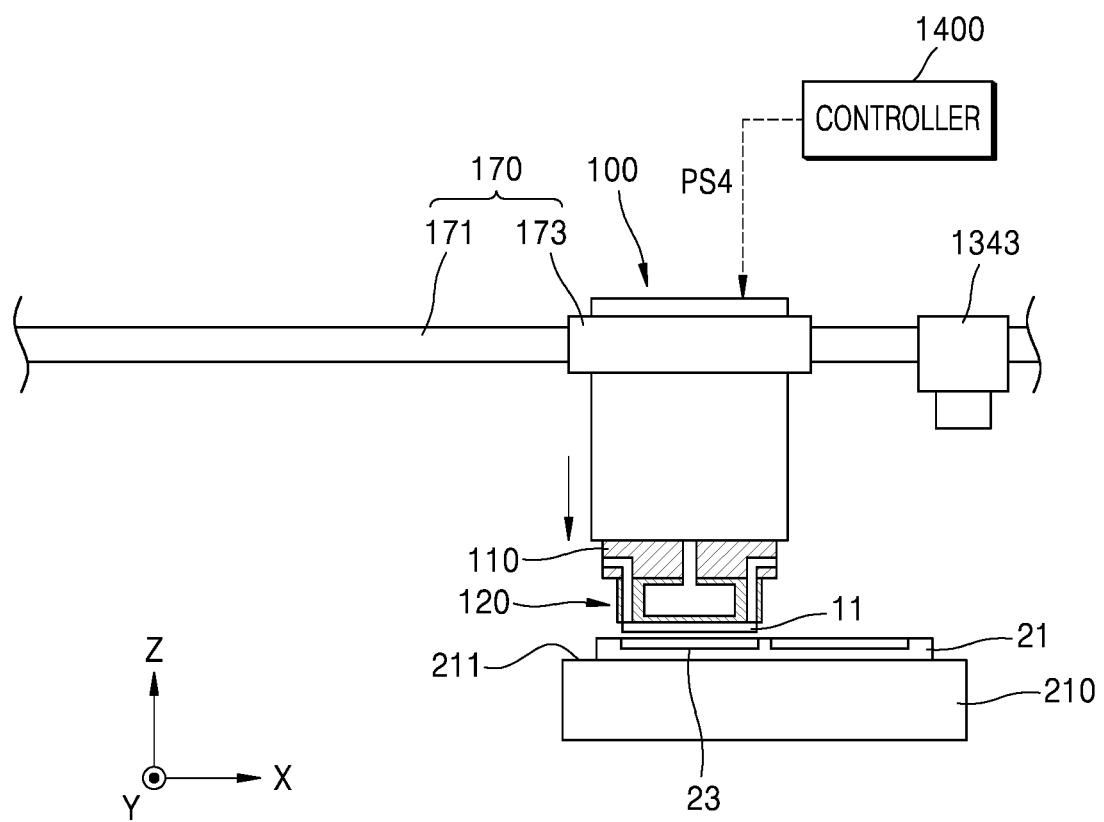

Referring to FIGS. 14, 15, and 16E, the Z-axis movement mechanism 141 of the bonding head 100 may lower the attachment pad 120 such that the semiconductor chip 11 and the substrate 21 are spaced apart from each other by a predetermined distance (operation S350). For example, the Z-axis movement mechanism 141 may adjust the Z-axis position of the attachment pad 120 according to a fourth position signal PS4 applied from the controller 1400.

In example embodiments, operation S330 for adjusting the position of the semiconductor chip 11 in the rotational direction and/or operation S340 for adjusting the position of the semiconductor chip 11 in the tilting direction may be performed while the attachment pad 120 is being lowered such that the semiconductor chip 11 and the substrate 21 are spaced apart from each other by a predetermined distance in operation S350.

Referring to FIGS. 14 and 15, when the semiconductor chip 11 is spaced apart from the substrate 21 by the predetermined distance, bonding between the semiconductor chip 11 and the substrate 21 is performed (operation S360). In operation S360, the semiconductor chip 11 and the substrate 21 may be bonded to each other using the chip-substrate bonding method described above with reference to FIGS. 4A through 4E or the chip-substrate bonding method described above with reference to FIGS. 5A through 5D.

When the bonding between the semiconductor chip 11 and the substrate 21 is completed, the bonding structure in which the semiconductor chip 11 and the substrate 21 are bonded is transferred to the loading/unloading stage 1350 along a first transfer path PC1 shown in FIG. 7, and then the transfer robot 1210 of the EFEM 1200 transfers the bonding structure to the second carrier CA2 along a second transfer path PC2 shown in FIG. 7 (operation S370).

According to example embodiments of the inventive concepts, a bonding alignment between the semiconductor chip 11 and the substrate 21 may be improved by adjusting the XY position, the rotational position, and the tilting position of the semiconductor chip 11. Therefore, the reliability of the bonding structure in which the semiconductor chip 11 and the substrate 21 are bonded to each other and a semiconductor product manufactured using the same may be improved.

Figure 17:
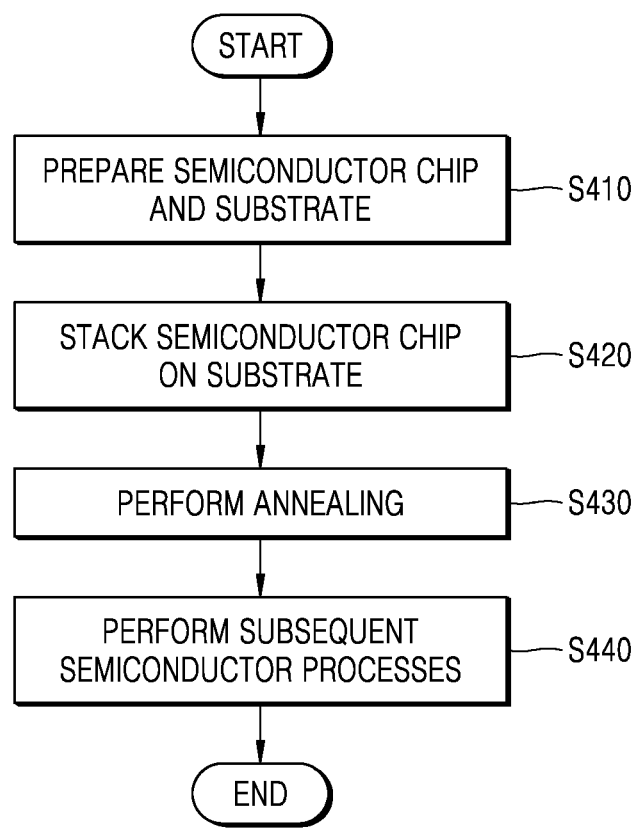
FIG. 17 is a flowchart of a semiconductor manufacturing method according to example embodiments.
Figure 18:
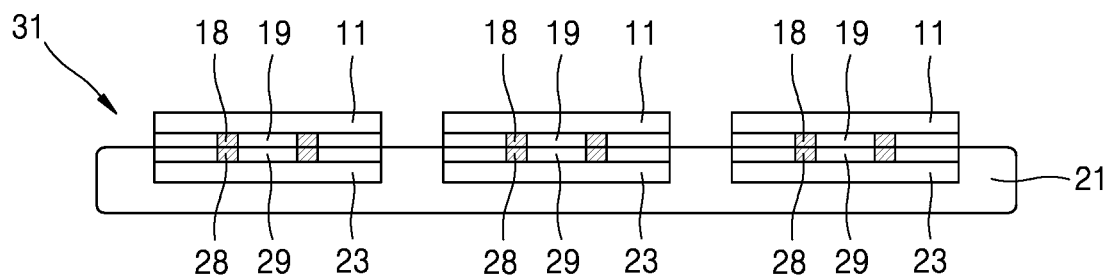
FIG. 18 is a cross-sectional view of a bonding structure in which a semiconductor chip and a substrate are bonded to each other.

FIG. 17 is a flowchart of a semiconductor manufacturing method according to example embodiments. FIG. 18 is a cross-sectional view of the bonding structure 31 in which the semiconductor chip 11 and the substrate 21 are bonded to each other.

Referring to FIGS. 17 and 18, the semiconductor chip 11 and the substrate 21 to be bonded are prepared (operation S410). The substrate 21 may be a wafer on which a plurality of chips 23 are formed. For example, the chips 23 may be embedded chips in the substrate 21. For example, the chips 23 may be integrated circuits formed in the substrate 21.

The semiconductor chip 11 may include a first insulation layer 19 and a first conductive pattern 18, and a chip 23 of the substrate 21 may include a second insulation layer 29 and a second conductive pattern 28. The first insulation layer 19 and the second insulation layer 29 may include or be formed of, for example, silicon oxide. The first conductive pattern 18 and the second conductive pattern 28 may include or be formed of, for example, copper (Cu).

As shown in FIG. 18, a plurality of semiconductor chips 11 and the plurality of chips 23 of the substrate 21 may be respectively bonded in the same process. A plurality of wiring structures for electrically connecting the respective semiconductor chips 11 and the chips 23 of the substrate 21. The individual devices may include or be various microelectronic devices, e.g., a metal-oxide-semiconductor field effect transistor (MOSFET), a system large scale integration (LSI), an image sensor like a CMOS imaging sensor (CIS), a micro-electro-mechanical system (MEMS), an active device, a passive device, etc. In example embodiments, the chip 23 of the substrate 21 may be a logic chip, and the semiconductor chip 11 may be a memory chip. In example embodiments, the chip 23 of the substrate 21 may be a logic chip, and the semiconductor chip 11 may be an image sensor chip.

Next, the semiconductor chips 11 may be stacked on the substrate 21 (operation S420). The semiconductor chips 11 may be aligned with and bonded to the chips 23 of the substrate 21. A surface of each of the semiconductor chips 11 and a surface of the substrate 21 contact each other, and the first conductive pattern 18 of the semiconductor chip 11 and the second conductive pattern 28 of the substrate 21 may contact each other. Although FIG. 18 shows that one semiconductor chip is stacked on each of the chips 23 of the substrate 21, two or more semiconductor chips may be stacked on each of the chips 23 of the substrate 21 in a vertical direction.

Next, when the stacking of the semiconductor chips 11 on the substrate 21 is completed, annealing is performed on the bonding structure 31 to which the semiconductor chips 11 and the substrate 21 are bonded, such that bonding strength between the semiconductor chips 11 and the substrate 21 is improved (operation S430). Due to the annealing, the first conductive pattern 18 of the semiconductor chip 11 and the second conductive pattern 28 of the substrate 21 may be more firmly bonded to each other than before the annealing, and the first insulation layer 19 of the semiconductor chip 11 may be more firmly bonded to the second insulation layer 29 of the substrate 21 than before the annealing.

Next, subsequent semiconductor processes are performed on the bonding structure 31(operation S440). The subsequent semiconductor processes may include various processes. For example, the subsequent semiconductor processes may include a deposition process, an etching process, an ion process, a cleaning process, etc. Here, the deposition process may include various material layer forming processes like CVD, sputtering, and spin coating. The ion process may include processes like ion implantation, diffusion, heat treatment, etc. Also, the subsequent semiconductor processes may include a packaging process of mounting a semiconductor device on a printed circuit board and forming a molding layer. Also, the subsequent semiconductor processes may include a test process for testing a semiconductor device or a semiconductor package. The subsequent semiconductor processes may be performed to complete a semiconductor device or a semiconductor package.

While the inventive concept has been particularly shown and described with reference to embodiments thereof, it will be understood that various changes in form and details may be made therein without departing from the spirit and scope of the following claims.

What is claimed is:

1. A semiconductor manufacturing apparatus configured to bond a substrate to a semiconductor chip, the semiconductor manufacturing apparatus comprising:
   a support configured to mount the substrate on a main surface of the support; and
   a bonding head configured to transfer the semiconductor chip to stack the semiconductor chip on the substrate and comprising an attachment pad configured to attach to the semiconductor chip, wherein the attachment pad comprises:
      a bottom surface configured to attach to the semiconductor chip;
      a vacuum channel extending from the bottom surface; and
      a cavity, and
   wherein the bonding head is configured to adjust a shape of the bottom surface of the attachment pad by adjusting a pressure of air in the cavity.

2. The semiconductor manufacturing apparatus of claim 1, wherein the bonding head is configured to deform the attachment pad between an initial state and a deformed state by adjusting the pressure of air in the cavity, in the initial state of the attachment pad, a center region and an edge region of the bottom surface of the attachment pad are at the same level, and,
   in the deformed state of the attachment pad, the center region of the bottom surface of the attachment pad protrudes with respect to the edge region of the bottom surface of the attachment pad.

3. The semiconductor manufacturing apparatus of claim 2, wherein the bonding head is configured to forcibly deform the semiconductor chip by deforming the attachment pad from the initial state to the deformed state while the semiconductor chip is attached to the attachment pad.

4. The semiconductor manufacturing apparatus of claim 1, wherein the attachment pad comprises silicon rubber.

5. The semiconductor manufacturing apparatus of claim 1, wherein the attachment pad comprises:
   a side wall portion in which the vacuum channel is disposed; and
   a bottom portion between the cavity and the bottom surface of the attachment pad, and
   wherein a thickness of the bottom portion is from about 0.5 mm to about 20 mm.

6. The semiconductor manufacturing apparatus of claim 1, wherein the bonding head is configured to rotate the attachment pad around a rotation axis extending in a direction perpendicular to the main surface of the support.

7. The semiconductor manufacturing apparatus of claim 1, wherein the bonding head is configured to tilt the attachment pad around a tilting axis extending in a direction parallel to the main surface of the support.

8. The semiconductor manufacturing apparatus of claim 1, further comprising:
a first image capturing device configured to capture an image of the semiconductor chip attached to the attachment pad;
a second image capturing device configured to capture an image of the substrate mounted on the support; and
a controller comprising an image processor configured to calculate relative positions of the semiconductor chip and the substrate with respect to each other based on image signals obtained by the first image capturing device and the second image capturing device.

9. The semiconductor manufacturing apparatus of claim 8, wherein, with respect to a rotational direction around a rotation axis extending in a Z-direction perpendicular to the main surface of the support, the controller is configured to apply a position control signal for aligning the semiconductor chip with the substrate in the rotational direction to the bonding head based on the image signals obtained by the first image capturing device and the second image capturing device.

10. The semiconductor manufacturing apparatus of claim 8, further comprising a sensor configured to detect a position of the semiconductor chip attached to the attachment pad in a tilting direction around a tilting axis extending in a direction parallel to the main surface of the support, wherein the controller is configured to apply a position control signal to the bonding head to adjust a position of the attachment pad in the tilting direction based on the position of the semiconductor chip in the tilting direction detected by the sensor.

11. The semiconductor manufacturing apparatus of claim 8, wherein the bonding head is configured to deform the attachment pad between an initial state of the attachment pad in which a center region and an edge region of the bottom surface of the attachment pad are at the same level and a deformed state in which the center region of the bottom surface of the attachment pad protrudes with respect to the edge region of the bottom surface of the attachment pad, and
the bonding head is configured to maintain the attachment pad in the initial state while the first image capturing device is capturing an image of the semiconductor chip.

12. A semiconductor manufacturing apparatus configured to bond a substrate to a semiconductor chip, the semiconductor manufacturing apparatus comprising:
a support configured to mount the substrate on a main surface of the support; and
a bonding head configured to transfer the semiconductor chip to stack the semiconductor chip on the substrate, wherein the bonding head comprises:
an attachment pad having a bottom surface configured to attach to the semiconductor chip and a cavity provided in the attachment pad, wherein the bottom surface has a shape that adjusts depending on a pressure in the cavity; and
a tilting movement actuator configured to tilt the attachment pad around a tilting axis extending in a direction parallel to the main surface of the support and comprising an actuator.

13. The semiconductor manufacturing apparatus of claim 12, wherein the bonding head is configured to move the semiconductor chip to contact the substrate while the attachment pad is tilted such that a bonding surface of the semiconductor chip is inclined with respect to a bonding surface of the substrate.

14. The semiconductor manufacturing apparatus of claim 12, wherein the attachment pad comprises a vacuum channel extending from the bottom surface of the attachment pad, the attachment pad configured to attach to the semiconductor chip, wherein the semiconductor manufacturing apparatus further comprises a vacuum pump connected to the vacuum channel to apply vacuum pressure to the vacuum channel.

15. The semiconductor manufacturing apparatus of claim 12, wherein
the bonding head further comprises an air pressure adjuster configured to adjust a pressure of air in the cavity by injecting or exhausting air into or from the cavity.

16. The semiconductor manufacturing apparatus of claim 12, wherein the bonding head further comprises a rotation movement actuator comprising an actuator, the rotation movement actuator configured to rotate the attachment pad around a rotation axis extending in a direction perpendicular to the main surface of the support.

17. A semiconductor manufacturing apparatus comprising:
a loading stage configured to load a ring frame on which a semiconductor chip is mounted;
a loading/unloading stage for loading and unloading a substrate;
a chip separation stage configured to reduce adhesion of an adhesive film of the ring frame supporting the semiconductor chip;
a bonding stage configured to perform a bonding process between the substrate and the semiconductor chip, the bonding stage comprising:
a support having a main surface configured to receive the substrate; and
a bonding head configured to stack the semiconductor chip on the substrate mounted on the support; and
a chip transfer module configured to transfer the semiconductor chip from the chip separation stage toward the bonding head, wherein the bonding head comprises:
an attachment pad comprising a bottom surface configured to attach to the semiconductor chip and a cavity provided in the attachment pad, and
an air pressure adjuster configured to inject or exhaust air into or from the cavity of the attachment pad, such that the pressure of air in the cavity of the attachment pad is adjusted.

18. The semiconductor manufacturing apparatus of claim 17, wherein the bonding head is configured to:
i) deform the attachment pad between an initial state of the attachment pad in which a center region and an edge region of the bottom surface of the attachment pad are at the same level and a deformed state in which the center region of the bottom surface of the attachment pad protrudes with respect to the edge region of the bottom surface of the attachment pad, and,
ii) deform the attachment pad from the initial state to the deformed state to forcibly deform the semiconductor chip while the semiconductor chip is attached to the attachment pad.

19. The semiconductor manufacturing apparatus of claim 17, wherein the bonding head further comprises:
a rotation movement actuator configured to rotate the attachment pad around a rotation axis extending in a direction perpendicular to the main surface of the support and comprising an actuator; and a tilting movement actuator configured to tilt the attachment pad around a tilting axis extending in a direction parallel to the main surface of the support and comprising an actuator.

20. The semiconductor manufacturing apparatus of claim 17, wherein the bonding stage further comprises a first image capturing device configured to capture an image of the semiconductor chip attached to the attachment pad and a second image capturing device configured to capture an image of the substrate mounted on the support, wherein the semiconductor manufacturing apparatus further comprises a controller comprising an image processor configured to calculate relative positions of the semiconductor chip and the substrate with respect to each other based on image signals obtained by the first image capturing device and the second image capturing device, and the controller is configured to apply a position control signal for transferring the semiconductor chip to the bonding head based on calculated relative positions.

* * * * *